(12) United States Patent
Kogure et al.

(10) Patent No.: US 12,126,308 B2
(45) Date of Patent: Oct. 22, 2024

(54) TRACKER MODULE, POWER AMPLIFIER MODULE, RADIO FREQUENCY MODULE, AND COMMUNICATION DEVICE

(71) Applicant: Murata Manufacturing Co., Ltd., Nagaokakyo (JP)

(72) Inventors: Takeshi Kogure, Nagaokakyo (JP); Tomohide Aramata, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 51 days.

(21) Appl. No.: 18/055,957

(22) Filed: Nov. 16, 2022

(65) Prior Publication Data

US 2023/0075733 A1  Mar. 9, 2023

Related U.S. Application Data

(63) Continuation of application No. PCT/JP2021/019521, filed on May 24, 2021.

(30) Foreign Application Priority Data

May 25, 2020 (JP) .................... 2020-090955

(51) Int. Cl.
H03F 1/06 (2006.01)
H03F 3/24 (2006.01)

(52) U.S. Cl.
CPC ........ *H03F 1/06* (2013.01); *H03F 3/24* (2013.01)

(58) Field of Classification Search
CPC ........................................................ H03F 1/06
USPC ........................................................ 332/153
See application file for complete search history.

(56) References Cited

U.S. PATENT DOCUMENTS

| | | | |
|---|---|---|---|
| 2009/0195334 | A1 | 8/2009 | Goi et al. |
| 2012/0200354 | A1 | 8/2012 | Ripley et al. |
| 2013/0194037 | A1 | 8/2013 | Takahashi |
| 2015/0084698 | A1 | 3/2015 | Ito et al. |
| 2016/0036389 | A1 | 2/2016 | Balteanu et al. |
| 2018/0152945 | A1* | 5/2018 | Balteanu ............ H04L 5/001 |
| 2020/0336110 | A1* | 10/2020 | Drogi ................ H04B 1/40 |

FOREIGN PATENT DOCUMENTS

| | | |
|---|---|---|
| JP | 2008028218 A | 2/2008 |
| JP | 2009182277 A | 8/2009 |
| JP | 2010278704 A | 12/2010 |
| JP | 2011120142 A | 6/2011 |
| JP | 2014505449 A | 2/2014 |
| JP | 2016032301 A | 3/2016 |
| WO | 2012046668 A1 | 4/2012 |
| WO | 2013176147 A1 | 11/2013 |

OTHER PUBLICATIONS

International Search Report in PCT/JP2021/019521, mailed on Jul. 6, 2021, 4 pages.

* cited by examiner

*Primary Examiner* — Joseph Chang
(74) *Attorney, Agent, or Firm* — ArentFox Schiff LLP

(57) ABSTRACT

A tracker module is provided that includes a second substrate that is separate from a first substrate, a tracker component, and a low pass filter. A power amplifier is disposed on or in the first substrate. Moreover, the tracker component supplies a power supply voltage to the power amplifier. The low pass filter is disposed on a path between an output terminal of the tracker component and the power amplifier. The tracker component and the low pass filter are disposed on or in the second substrate.

17 Claims, 17 Drawing Sheets

TRACKER MODULE, POWER AMPLIFIER MODULE, RADIO FREQUENCY MODULE, AND COMMUNICATION DEVICE

CROSS REFERENCE TO RELATED APPLICATIONS

This application is a continuation of PCT Application No. PCT/JP2021/019521, filed May 24, 2021, which claims priority to Japanese Patent Application No. 2020-090955, filed May 25, 2020, the entire contents of each of which are hereby incorporated by reference in their entirety.

FIELD OF THE INVENTION

The present invention generally relates to tracker modules, power amplifier (PA) modules, radio frequency (RF) modules, and communication devices. More specifically, the present invention relates to a tracker module including a tracker component, a PA module including a tracker component, an RF module including the PA module, and a communication device including the RF module.

BACKGROUND

In recent years, PA circuits employing an envelope tracking method (hereinafter referred to as an "ET method") have been known (see, for example, International Publication No. 2013/176147). The ET method is an RF amplification technique of changing the amplitude of the power supply voltage for an amplifier element in accordance with the amplitude of the envelope of an RF signal. More specifically, the ET method is a technique of changing the collector voltage of an amplifier element in accordance with an output voltage, thereby reducing power loss generated during operation when the power supply voltage is fixed, and achieving higher efficiency.

The PA circuit described in International Publication No. 2013/176147 includes a transistor that amplifies a signal input to the base and outputs the amplified signal from the collector. As such, the power supply voltage for the transistor is changed in accordance with the amplitude of the envelope of an RF signal, and is supplied to the transistor.

In the PA circuit described in International Publication No. 2013/176147, a low pass filter is connected to a path between a tracker component and a PA in order to reduce harmonic components of the power supply voltage from the tracker component.

However, the existing PA circuit tends to have high power consumption because of parasitic resistance generated in the path between the tracker component and the low pass filter.

SUMMARY OF THE INVENTION

Accordingly, it is an object of the present invention to provide a tracker module, a power amplifier module, a radio frequency module, and a communication device that reduce power consumption.

In an exemplary aspect, a tracker module is provided that includes a second substrate that is separate from a first substrate, a tracker component, and a low pass filter. A power amplifier is disposed on or in the first substrate. Moreover, the tracker component is configured to supply a power supply voltage to the power amplifier. The low pass filter is disposed on a path between an output terminal of the tracker component and the power amplifier. The tracker component and the low pass filter are disposed on or in the second substrate.

According to an exemplary aspect, a tracker module includes a tracker component and a low pass filter. The tracker component is configured to output a power supply voltage for a power amplifier. The low pass filter is connected to an output terminal of the tracker component. A first path length of a path between the tracker component and the low pass filter is shorter than a second path length of a path between the low pass filter and the power amplifier.

According to an exemplary aspect, a power amplifier module includes the tracker module and the power amplifier.

According to an exemplary aspect, a radio frequency module includes the tracker module, the power amplifier, and a transmission filter. Moreover, the transmission filter is configured to allow a radio frequency signal amplified by the power amplifier to pass therethrough.

According to an exemplary aspect, a communication device includes the radio frequency module and a signal processing circuit. The signal processing circuit is configured to output a radio frequency signal to the radio frequency module.

With the tracker module, the power amplifier module, the radio frequency module, and the communication device according to the above exemplary aspects of the present invention, the power consumption of the tracker module is reduced.

DETAILED DESCRIPTION OF EMBODIMENTS

Hereinafter, a tracker module, a power amplifier (PA) module, a radio frequency (RF) module, and a communication device according to exemplary embodiments will be described with reference to the drawings. The individual figures referred to in the following embodiments and the like are schematic diagrams. It should be appreciated that the sizes and thicknesses of the individual constituent elements in the figures, and the ratios thereof do not necessarily reflect the actual dimensional ratios.

First Exemplary Embodiment

Tracker Module

The configuration of a tracker module 1 according to a first exemplary embodiment will be described with reference to the drawings.

Figure 1:
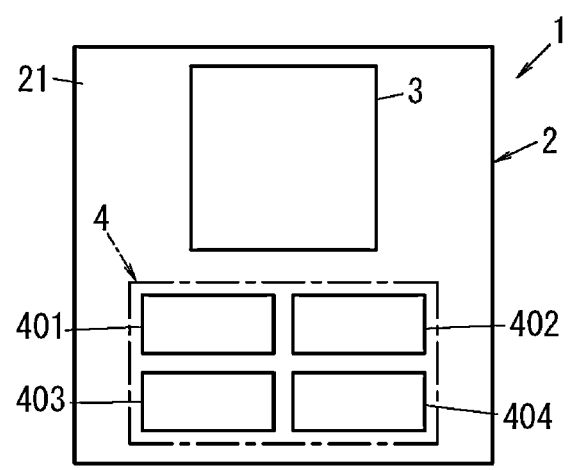
FIG. 1 is a plan view of a tracker module according to a first exemplary embodiment.
Figure 2:
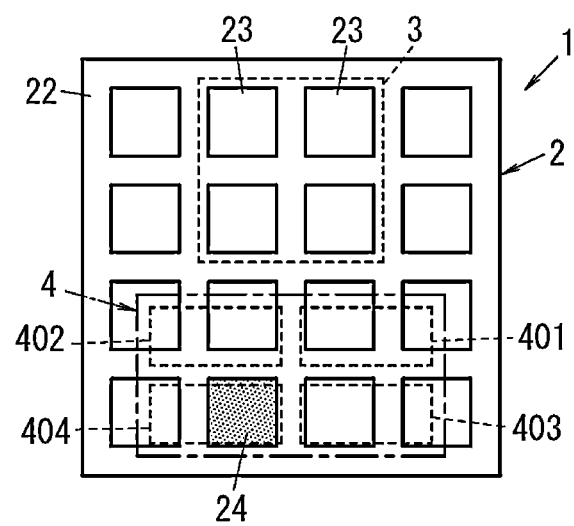
FIG. 2 is a perspective view of the tracker module according to the first exemplary embodiment.

As illustrated in FIG. 1 and FIG. 2, the tracker module 1 according to the first embodiment includes a substrate 2, a tracker component 3, a low pass filter 4, and a plurality of (e.g., sixteen in the illustrated example) external connection terminals 23. The tracker module 1 is connected to, for example, a battery (not illustrated) of a communication device 7 (see FIG. 3), such as a terminal, equipped with an RF module 5, and is supplied with a battery voltage V2 (see FIG. 3) from the battery.

(2) RF Module

Next, the RF module 5 including the tracker module 1 will be described with reference to the drawings.

Figure 3:
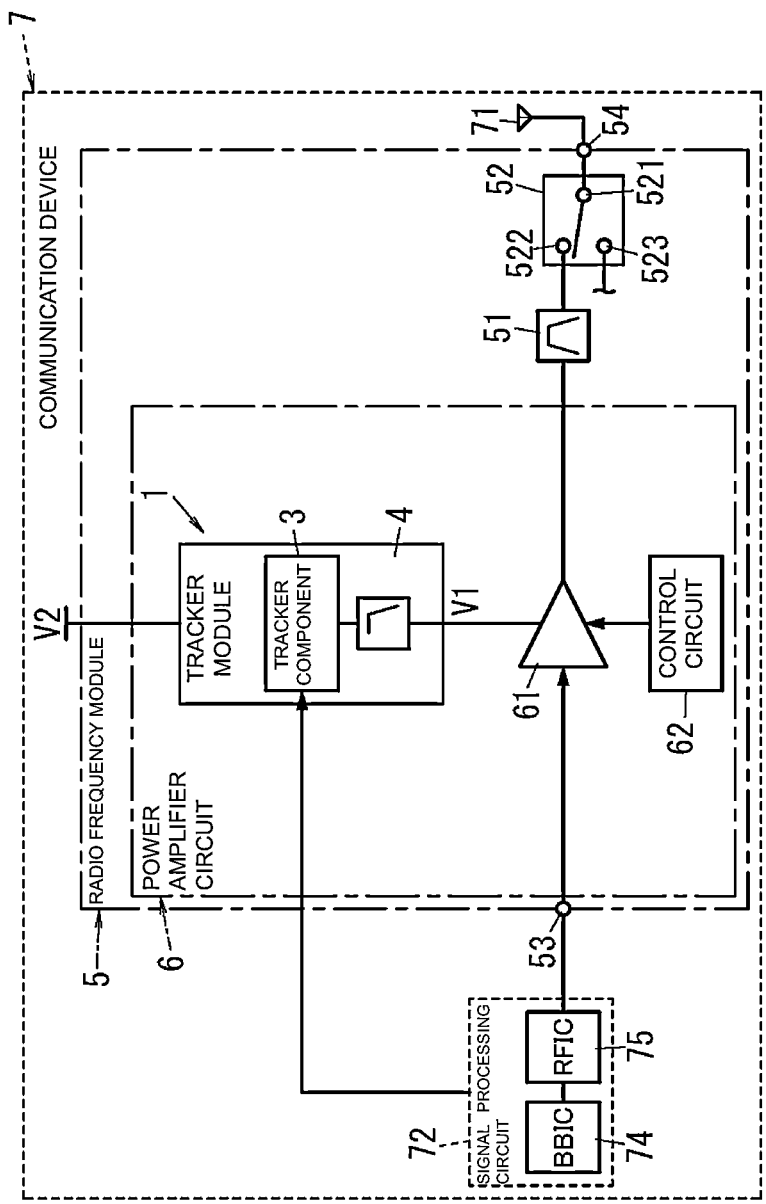
FIG. 3 is a conceptual diagram illustrating the configurations of the tracker module, a power amplifier (PA) module, a radio frequency (RF) module, and a communication device according to the first exemplary embodiment.

As illustrated in FIG. 3, the RF module 5 includes the tracker module 1, a PA circuit 6, a filter 51, a switch 52, an input terminal 53, and an antenna terminal 54. An RF signal output from the RF module 5 is transmitted to a base station (not illustrated) via an antenna 71, which will be described below. The RF module 5 is used for the communication device 7 or the like, which will be described below.

(3) Communication Device

Next, the communication device 7 including the RF module 5 will be described with reference to the drawings.

As illustrated in FIG. 3, the communication device 7 includes the RF module 5, the antenna 71, and a signal processing circuit 72. The communication device 7 is, for example, a mobile phone, such as a smartphone or the like. The communication device 7 is not limited to a mobile phone, and may be, for example, a wearable terminal such as a smart watch. In other words, the communication device 7 corresponds to user equipment (UE) in a cellular network, and is typically a mobile phone, a smartphone, a tablet computer, a wearable device, or the like. The communication device 7 may be an Internet of Things (IoT) sensor device, a medical/health-care device, a vehicle, an unmanned aerial vehicle (UAV) (a so-called drone), or an automated guided vehicle (AGV).

To amplify an RF signal, an envelope tracking method (hereinafter referred to as an "ET method") is used herein. The ET method includes an analog envelope tracking method (hereinafter referred to as an "analog ET method") and a digital envelope tracking method (hereinafter referred to as a "digital ET method").

In general, the analog ET method is a method of continuously assigning the amplitude level of the power supply voltage for an amplifier element in accordance with the envelope of the amplitude of an RF signal input to the amplifier element. In the analog ET method, the envelope is continuously detected, and thus the amplitude level of the power supply voltage continuously changes.

The digital ET method is a method of discretely supplying power supply voltages in amplitude levels to an amplifier element in accordance with the envelope of the amplitude of an RF signal input to the amplifier element. In the digital ET method, the voltage level of the power supply voltage is selected from among a plurality of discrete voltage levels in response to a digital control signal corresponding to an envelope signal, and changes with time. The envelope signal is a signal indicating the envelope value of a modulated wave (e.g., an RF signal). The envelope value is, for example, $(I^2+Q^2)^{1/2}$. (I, Q) represents a constellation point herein. The constellation point is a point representing, on a constellation diagram, a signal modulated by digital modulation.

(4) Constituent Elements of Tracker Module

Hereinafter, the individual constituent elements of the tracker module 1 according to the first embodiment will be described with reference to the drawings.

(4.1) Substrate

The substrate 2 illustrated in FIG. 1 is a substrate that is separate from a first substrate on or in which a PA 61 (see FIG. 3) is disposed. As illustrated in FIG. 1 and FIG. 2, the substrate 2 has a first main surface 21 and a second main surface 22. The first main surface 21 and the second main surface 22 are opposed to each other in the thickness direction of the substrate 2.

The plurality of (e.g., sixteen in the illustrated example) external connection terminals 23 are disposed on the second main surface 22 of the substrate 2. The plurality of external connection terminals 23 include a PA connection terminal 24 (e.g., an output terminal) to be connected to the PA 61 (see FIG. 3).

(4.2) Tracker Component

As illustrated in FIG. 3, the tracker component 3 is configured to supply a power supply voltage V1 to the PA 61. More specifically, the tracker component 3 generates the power supply voltage V1 having a level corresponding to an envelope extracted from a modulated signal of an RF signal, and supplies the power supply voltage V1 to the PA 61.

The tracker component 3 includes an input terminal (not illustrated) that receives a power supply control signal, and an output terminal (not illustrated) that outputs the power supply voltage V1. The input terminal is connected to the signal processing circuit 72 and receives a power supply control signal from the signal processing circuit 72. The tracker component 3 generates the power supply voltage V1 in response to the power supply control signal received by the input terminal. At this time, the tracker component 3 changes the amplitude of the power supply voltage V1 in response to the power supply control signal from the signal processing circuit 72. In other words, the tracker component 3 is an envelope tracking circuit that generates the power supply voltage V1 that varies in accordance with the envelope of the amplitude of an RF signal output from the signal processing circuit 72. The tracker component 3 includes, for example, a direct-current (DC)-DC converter, detects the amplitude level of the RF signal from an I-phase signal and a Q-phase signal, and generates the power supply voltage V1 by using the detected amplitude level.

(4.3) Low Pass Filter

As illustrated in FIG. 3, the low pass filter 4 is disposed on a path between the output terminal of the tracker component 3 and the PA 61. As illustrated in FIG. 1, the low pass filter 4 includes a plurality of (e.g., four in the illustrated example) electronic components 401 to 404. The low pass filter 4 is, for example, a so-called LC filter including an inductor and a capacitor as main constituent elements.

The low pass filter 4 of the first embodiment reduces harmonic components of the power supply voltage V1. Accordingly, noise resulting from the power supply voltage V1 can be reduced.

(4.4) Disposition Relationship Among Tracker Component, Low Pass Filter, and PA Connection Terminal In the tracker module 1 described above, the tracker component 3 and the low pass filter 4 are disposed on or in the substrate 2, as illustrated in FIG. 1. More specifically, the tracker component 3 and the low pass filter 4 are disposed on the first main surface 21 of the substrate 2. In the example in FIG. 1, the plurality of electronic components 401 to 404 are disposed on or in the substrate 2. More specifically, the plurality of electronic components 401 to 404 are disposed on the first main surface 21 of the substrate 2. This disposition reduces parasitic resistance components generated in a path 81A (see FIG. 4) between the tracker component 3 and the low pass filter 4.

In the first embodiment, the tracker component 3 and the low pass filter 4 are integrated together into one package. This configuration makes further reduces parasitic resistance components generated in the path 81A between the tracker component 3 and the low pass filter 4.

In the first embodiment, the tracker component 3 is disposed adjacent to the low pass filter 4 on or in the substrate 2. More specifically, two electronic components 401 and 402 of the plurality of electronic components 401 to 404 are disposed adjacent to the tracker component 3. This disposition further shortens the path 81A between the tracker component 3 and the low pass filter 4, and thus further reduces parasitic resistance components generated in the path 81A between the tracker component 3 and the low pass filter 4.

The PA connection terminal 24 is disposed on the second main surface 22 of the substrate 2, and overlaps the low pass filter 4 in plan view in the thickness direction of the substrate 2. In the example in FIG. 2, the PA connection terminal 24 overlaps the electronic component 404. This disposition shortens a path between the low pass filter 4 and the PA connection terminal 24, that is, a path 82A (see FIG. 4) between the low pass filter 4 and the PA 61 (see FIG. 3), and thus reduces parasitic resistance components generated in the path 82A between the low pass filter 4 and the PA 61.

(5) Details of Tracker Module

Next, the tracker module 1 according to the first embodiment will be described in detail with reference to FIG. 6 and FIG. 7.

Figure 6:
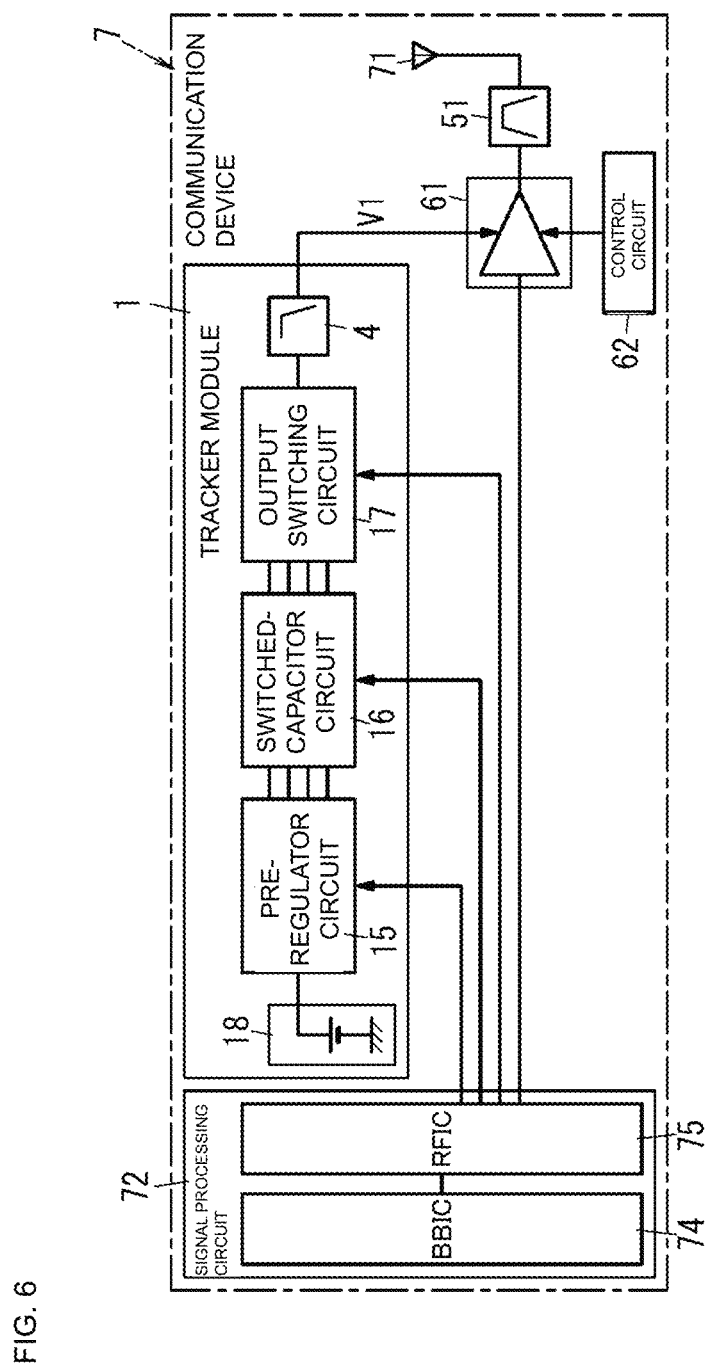
FIG. 6 is a conceptual diagram illustrating the configuration of the communication device according to the first exemplary embodiment.
Figure 7:
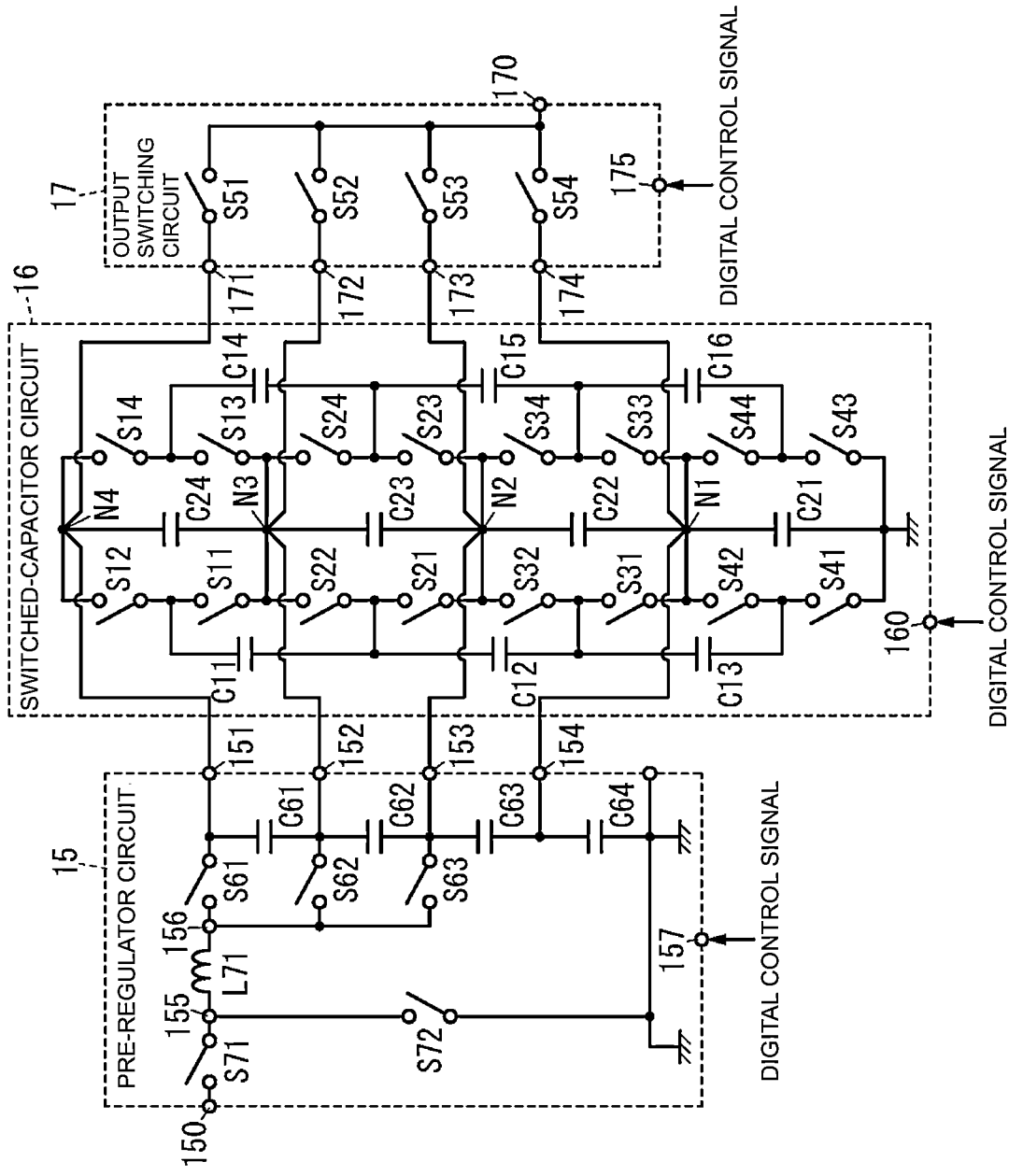
FIG. 7 is a conceptual diagram illustrating the configuration of the tracker module according to the first exemplary embodiment.

As illustrated in FIG. 6 and FIG. 7, the tracker module 1 includes a pre-regulator circuit 15, a switched-capacitor circuit 16, an output switching circuit 17, and a DC power supply 18.

The tracker module 1 supplies the PA 61 with the power supply voltage V1 having a power supply voltage level selected from among a plurality of discrete voltage levels in response to an envelope signal.

The pre-regulator circuit 15 includes a power inductor and switches. The power inductor is an inductor used to raise and/or lower (raise, lower, or raise and lower) a DC voltage. The power inductor is disposed in series in a DC path. The pre-regulator circuit 15 converts a voltage by using the power inductor. The pre-regulator circuit 15 may also be referred to as a magnetic regulator or a DC-DC converter. Alternatively, the power inductor may be connected between a series-arm path and the ground (disposed in parallel).

The pre-regulator circuit 15 does not necessarily need to include the power inductor, and may be, for example, a circuit or the like that raises and/or lowers (raises, lowers, or raises and lowers) a voltage by switching between capacitors disposed on the series-arm path and a parallel-arm path of the pre-regulator circuit 15.

In the exemplary aspect, the switched-capacitor circuit 16 includes a plurality of capacitors and a plurality of switches, and is configured for generating a plurality of voltages respectively having a plurality of discrete voltage levels from the voltage output from the pre-regulator circuit 15. The switched-capacitor circuit 16 may also be referred to as a switched-capacitor voltage balancer.

The output switching circuit 17 selects, in response to a digital control signal corresponding to an envelope signal, at least one of the plurality of voltages generated by the switched-capacitor circuit 16, and outputs the selected voltage to the low pass filter 4.

The DC power supply 18 supplies a DC voltage to the pre-regulator circuit 15. The DC power supply 18 may be, and is not limited to, a rechargeable battery, for example.

The tracker module 1 does not necessarily need to include at least one of the pre-regulator circuit 15 and the DC power supply 18. For example, the tracker module 1 does not necessarily need to include the DC power supply 18. Any combination of the pre-regulator circuit 15, the switched-capacitor circuit 16, and the output switching circuit 17 may be integrated into a single circuit. A detailed circuit configuration example of the tracker module 1 will be described below with reference to FIG. 7.

(5.1) Circuit Configuration of Tracker Module

Next, the circuit configurations of the pre-regulator circuit 15, the switched-capacitor circuit 16, and the output switching circuit 17 included in the tracker module 1 will be described with reference to FIG. 7.

FIG. 7 illustrates an exemplary circuit configuration. The pre-regulator circuit 15, the switched-capacitor circuit 16, and the output switching circuit 17 may be mounted by using any one of a wide variety of circuit packaging methods and circuit techniques. Thus, the description of the individual circuits provided below should not be construed in a limiting manner.

(5.2) Switched-Capacitor Circuit

As illustrated in FIG. 7, the switched-capacitor circuit 16 includes a plurality of (six in the illustrated example) capacitors C11 to C16, a plurality of (four in the illustrated example) capacitors C21 to C24, a plurality of (sixteen in the illustrated example) switches S11 to S14, S21 to S24, S31 to S34, and S41 to S44, and a control terminal 160.

The control terminal 160 is an input terminal for a digital control signal. More specifically, the control terminal 160 is a terminal for receiving a digital control signal for controlling the switched-capacitor circuit 16. The digital control signal received via the control terminal 160 is, for example, a control signal of a source synchronous scheme in which a data signal and a clock signal are transmitted. The digital control signal is not limited to the control signal of the source synchronous scheme. For example, the digital control signal may be a control signal of a clock embedded scheme.

The plurality of capacitors C11 to C16 each function as a flying capacitor (e.g., a transfer capacitor). That is, the plurality of capacitors C11 to C16 are each used to raise or lower the voltage supplied from the pre-regulator circuit 15. More specifically, the plurality of capacitors C11 to C16 cause electric charges to move between the capacitors C11 to C16 and nodes N1 to N4 so that voltages V41 to V44 (voltages with respect to the ground potential) satisfying V41:V42:V43:V44=1:2:3:4 are maintained at the four nodes N1 to N4. The plurality of voltages V41 to V44 correspond to a plurality of voltages respectively having a plurality of discrete voltage levels. The voltage V41 is the voltage at the node N1, the voltage V42 is the voltage at the node N2, the voltage V43 is the voltage at the node N3, and the voltage V44 is the voltage at the node N4.

The capacitor C11 has two electrodes (e.g., a first electrode and a second electrode). One of the two electrodes (first electrode) of the capacitor C11 is connected to one terminal (first terminal) of the switch S11 and one terminal (first terminal) of the switch S12. The other of the two electrodes (second electrode) of the capacitor C11 is connected to one terminal (first terminal) of the switch S21 and one terminal (first terminal) of the switch S22.

The capacitor C12 has two electrodes (e.g., a first electrode and a second electrode). One of the two electrodes (first electrode) of the capacitor C12 is connected to the one terminal (first terminal) of the switch S21 and the one terminal (first terminal) of the switch S22. The other of the two electrodes (second electrode) of the capacitor C12 is connected to one terminal (first terminal) of the switch S31 and one terminal (first terminal) of the switch S32.

The capacitor C13 has two electrodes (e.g., a first electrode and a second electrode). One of the two electrodes (first electrode) of the capacitor C13 is connected to the one terminal (first terminal) of the switch S31 and the one terminal (first terminal) of the switch S32. The other of the two electrodes (second electrode) of the capacitor C13 is connected to one terminal (first terminal) of the switch S41 and one terminal (first terminal) of the switch S42.

The capacitor C14 has two electrodes (e.g., a first electrode and a second electrode). One of the two electrodes (first electrode) of the capacitor C14 is connected to one terminal (first terminal) of the switch S13 and one terminal (first terminal) of the switch S14. The other of the two electrodes (second electrode) of the capacitor C14 is connected to one terminal (first terminal) of the switch S23 and one terminal (first terminal) of the switch S24.

The capacitor C15 has two electrodes (e.g., a first electrode and a second electrode). One of the two electrodes (first electrode) of the capacitor C15 is connected to the one terminal (first terminal) of the switch S23 and the one terminal (first terminal) of the switch S24. The other of the two electrodes (second electrode) of the capacitor C15 is connected to one terminal (first terminal) of the switch S33 and one terminal (first terminal) of the switch S34.

The capacitor C16 has two electrodes (e.g., a first electrode and a second electrode). One of the two electrodes (first electrode) of the capacitor C16 is connected to the one terminal (first terminal) of the switch S33 and the one terminal (first terminal) of the switch S34. The other of the two electrodes (second electrode) of the capacitor C16 is connected to one terminal (first terminal) of the switch S43 and one terminal (first terminal) of the switch S44.

In operation, a set of the capacitors C11 and C14, a set of the capacitors C12 and C15, and a set of the capacitors C13 and C16 can each be charged and discharged in a complementary manner as a result of the following first phase and second phase being repeated.

Specifically, in the first phase, the switches S12, S13, S22, S23, S32, S33, S42, and S43 are turned ON. Accordingly, for example, the one of the two electrodes (first electrode) of the capacitor C12 is connected to the node N3, the other of the two electrodes (second electrode) of the capacitor C12 and the one of the two electrodes (first electrode) of the capacitor C15 are connected to the node N2, and the other of the two electrodes (second electrode) of the capacitor C15 is connected to the node N1.

On the other hand, in the second phase, the switches S11, S14, S21, S24, S31, S34, S41, and S44 are turned ON. Accordingly, for example, the one of the two electrodes (first electrode) of the capacitor C15 is connected to the node N3, the other of the two electrodes (second electrode) of the capacitor C15 and the one of the two electrodes (first electrode) of the capacitor C12 are connected to the node N2, and the other of the two electrodes (second electrode) of the capacitor C12 is connected to the node N1.

As a result of the first phase and the second phase being repeated, for example, when one of the capacitors C12 and C15 is charged through the node N2, the other of the capacitors C12 and C15 can be discharged to the capacitor C23. In short, the capacitors C12 and C15 can be charged and discharged in a complementary manner. The capacitors C12 and C15 serve as a pair of flying capacitors that are charged and discharged in a complementary manner.

Similarly to the set of the capacitors C12 and C15, a set of any one of the capacitors C11 to C13 and any one of the capacitors C14 to C16 also serves as a pair of flying capacitors that are charged through a node and discharged to a smoothing capacitor in a complementary manner as a result of appropriate switching.

The plurality of capacitors C21 to C24 each function as a smoothing capacitor. Specifically, the capacitors C21 to C24 are used to hold and smooth the voltages V41 to V44 at the nodes N1 to N4.

The capacitor C21 is connected between the node N1 and the ground. Specifically, one of the two electrodes (first electrode) of the capacitor C21 is connected to the node N1. On the other hand, the other of the two electrodes (second electrode) of the capacitor C21 is connected to the ground.

The capacitor C22 is connected between the node N2 and the node N1. Specifically, one of the two electrodes (first electrode) of the capacitor C22 is connected to the node N2.

On the other hand, the other of the two electrodes (second electrode) of the capacitor C22 is connected to the node N1.

The capacitor C23 is connected between the node N3 and the node N2. Specifically, one of the two electrodes (first electrode) of the capacitor C23 is connected to the node N3. On the other hand, the other of the two electrodes (second electrode) of the capacitor C23 is connected to the node N2.

The capacitor C24 is connected between the node N4 and the node N3. Specifically, one of the two electrodes (first electrode) of the capacitor C24 is connected to the node N4. On the other hand, the other of the two electrodes (second electrode) of the capacitor C24 is connected to the node N3.

The switch S11 is connected between the one of the two electrodes (first electrode) of the capacitor C11 and the node N3. Specifically, the one terminal (first terminal) of the switch S11 is connected to the one of the two electrodes of the capacitor C11. On the other hand, the other terminal (second terminal) of the switch S11 is connected to the node N3.

The switch S12 is connected between the one of the two electrodes (first electrode) of the capacitor C11 and the node N4. Specifically, the one terminal (first terminal) of the switch S12 is connected to the one of the two electrodes of the capacitor C11. On the other hand, the other terminal (second terminal) of the switch S12 is connected to the node N4.

The switch S21 is connected between the one of the two electrodes (first electrode) of the capacitor C12 and the node N2. Specifically, the one terminal (first terminal) of the switch S21 is connected to the one of the two electrodes of the capacitor C12 and the other of the two electrodes (second electrode) of the capacitor C11. On the other hand, the other terminal (second terminal) of the switch S21 is connected to the node N2.

The switch S22 is connected between the one of the two electrodes (first electrode) of the capacitor C12 and the node N3. Specifically, the one terminal (first terminal) of the switch S22 is connected to the one of the two electrodes of the capacitor C12 and the other of the two electrodes (second electrode) of the capacitor C11. On the other hand, the other terminal (second terminal) of the switch S22 is connected to the node N3.

The switch S31 is connected between the other of the two electrodes (second electrode) of the capacitor C12 and the node N1. Specifically, the one terminal (first terminal) of the switch S31 is connected to the other of the two electrodes of the capacitor C12 and the one of the two electrodes (first electrode) of the capacitor C13. On the other hand, the other terminal (second terminal) of the switch S31 is connected to the node N1.

The switch S32 is connected between the other of the two electrodes (second electrode) of the capacitor C12 and the node N2. Specifically, the one terminal (first terminal) of the switch S32 is connected to the other of the two electrodes of the capacitor C12 and the one of the two electrodes (first electrode) of the capacitor C13. On the other hand, the other terminal (second terminal) of the switch S32 is connected to the node N2. That is, the other terminal of the switch S32 is connected to the other terminal (second terminal) of the switch S21.

The switch S41 is connected between the other of the two electrodes (second electrode) of the capacitor C13 and the ground. Specifically, the one terminal (first terminal) of the switch S41 is connected to the other of the two electrodes (second electrode) of the capacitor C13. On the other hand, the other terminal (second terminal) of the switch S41 is connected to the ground.

The switch S42 is connected between the other of the two electrodes (second electrode) of the capacitor C13 and the node N1. Specifically, the one terminal (first terminal) of the switch S42 is connected to the other of the two electrodes (second electrode) of the capacitor C13. On the other hand, the other terminal (second terminal) of the switch S42 is connected to the node N1. That is, the other terminal of the switch S42 is connected to the other terminal (second terminal) of the switch 531.

The switch S13 is connected between the one of the two electrodes (first electrode) of the capacitor C14 and the node N3. Specifically, the one terminal (first terminal) of the switch S13 is connected to the one of the two electrodes (first electrode) of the capacitor C14. On the other hand, the other terminal (second terminal) of the switch S13 is connected to the node N3. That is, the other terminal of the switch S13 is connected to the other terminal (second terminal) of the switch S11 and the other terminal (second terminal) of the switch S22.

The switch S14 is connected between the one of the two electrodes (first electrode) of the capacitor C14 and the node N4. Specifically, the one terminal (first terminal) of the switch S14 is connected to the one of the two electrodes (first electrode) of the capacitor C14. On the other hand, the other terminal (second terminal) of the switch S14 is connected to the node N4. That is, the other terminal of the switch S14 is connected to the other terminal (second terminal) of the switch S12.

The switch S23 is connected between the one of the two electrodes (first electrode) of the capacitor C15 and the node N2. Specifically, the one terminal (first terminal) of the switch S23 is connected to the one of the two electrodes (first electrode) of the capacitor C15 and the other of the two electrodes (second electrode) of the capacitor C14. On the other hand, the other terminal (second terminal) of the switch S23 is connected to the node N2. That is, the other terminal of the switch S23 is connected to the other terminal (second terminal) of the switch S21 and the other terminal (second terminal) of the switch S32.

The switch S24 is connected between the one of the two electrodes (first electrode) of the capacitor C15 and the node N3. Specifically, the one terminal (first terminal) of the switch S24 is connected to the one of the two electrodes (first electrode) of the capacitor C15 and the other of the two electrodes (second electrode) of the capacitor C14. On the other hand, the other terminal (second terminal) of the switch S24 is connected to the node N3. That is, the other terminal of the switch S24 is connected to the other terminal (second terminal) of the switch S11, the other terminal (second terminal) of the switch S22, and the other terminal (second terminal) of the switch S13.

The switch S33 is connected between the other of the two electrodes (second electrode) of the capacitor C15 and the node N1. Specifically, the one terminal (first terminal) of the switch S33 is connected to the other of the two electrodes (second electrode) of the capacitor C15 and the one of the two electrodes (first electrode) of the capacitor C16. On the other hand, the other terminal (second terminal) of the switch S33 is connected to the node N1. That is, the other terminal of the switch S33 is connected to the other terminal (second terminal) of the switch S31 and the other terminal (second terminal) of the switch S42.

The switch S34 is connected between the other of the two electrodes (second electrode) of the capacitor C15 and the node N2. Specifically, the one terminal (first terminal) of the switch S34 is connected to the other of the two electrodes (second electrode) of the capacitor C15 and the one of the two electrodes (first electrode) of the capacitor C16. On the other hand, the other terminal (second terminal) of the switch S34 is connected to the node N2. That is, the other terminal of the switch S34 is connected to the other terminal (second terminal) of the switch S21, the other terminal (second terminal) of the switch S32, and the other terminal (second terminal) of the switch S23.

The switch S43 is connected between the other of the two electrodes (second electrode) of the capacitor C16 and the ground. Specifically, the one terminal (first terminal) of the switch S43 is connected to the other of the two electrodes (second electrode) of the capacitor C16. On the other hand, the other terminal (second terminal) of the switch S43 is connected to the ground.

The switch S44 is connected between the other of the two electrodes (second electrode) of the capacitor C16 and the node N1. Specifically, the one terminal (first terminal) of the switch S44 is connected to the other of the two electrodes (second electrode) of the capacitor C16. On the other hand, the other terminal (second terminal) of the switch S44 is connected to the node N1. That is, the other terminal of the switch S44 is connected to the other terminal (second terminal) of the switch S31, the other terminal (second terminal) of the switch S42, and the other terminal (second terminal) of the switch S33.

In operation, a first set of switches including the switches S12, S13, S22, S23, S32, S33, S42, and S43, and a second set of switches including the switches S11, S14, S21, S24, S31, S34, S41, and S44 are turned ON and OFF in a complementary manner. Specifically, in the first phase, the switches in the first set are turned ON whereas the switches in the second set are turned OFF. Conversely, in the second phase, the switches in the first set are turned OFF whereas the switches in the second set are turned ON.

For example, in one of the first phase and the second phase, charging from the capacitors C11 to C13 to the capacitors C21 to C24 is performed, and in the other of the first phase and the second phase, charging from the capacitors C14 to C16 to the capacitors C21 to C24 is performed. In other words, because the capacitors C21 to C24 are constantly charged by the capacitors C11 to C13 or the capacitors C14 to C16, the nodes N1 to N4 are rapidly replenished with electric charges even if currents rapidly flow from the nodes N1 to N4 to the output switching circuit 17. Thus, potential variations at the nodes N1 to N4 can be suppressed.

As a result of operating in the above-described manner, the switched-capacitor circuit 16 maintains substantially equal voltages across each of the capacitors C21 to C24. Specifically, the voltages V41 to V44 (e.g., voltages with respect to the ground potential) satisfying V41:V42:V43:V44=1:2:3:4 are maintained at the four nodes N1 to N4. The levels of the voltages V41 to V44 correspond to a plurality of discrete voltage levels supplied to the output switching circuit 17 by the switched-capacitor circuit 16.

It should be appreciated that the voltage ratio V41:V42:V43:V44 is not limited to 1:2:3:4. For example, the voltage ratio V41:V42:V43:V44 may be 1:2:4:8.

The configuration of the switched-capacitor circuit 16 illustrated in FIG. 7 is an example. Thus, it is noted that the configuration of the switched-capacitor circuit 16 is not limited to the configuration illustrated in FIG. 7. In FIG. 7, the switched-capacitor circuit 16 is configured to supply voltages of four discrete voltage levels, but it is noted that the configuration thereof is not limited to the configuration of supplying voltages of four discrete voltage levels. Instead, the switched-capacitor circuit 16 can be configured to supply voltages of any number of two or more discrete voltage levels. For example, when voltages of two discrete voltage levels are supplied, it is sufficient that the switched-capacitor circuit 16 include at least the capacitors C12 and C15 and the switches S21, S22, S31, S32, S23, S24, S33, and S34.

The switches included in the switched-capacitor circuit 16 are included in the tracker component 3. Specifically, the tracker component 3 includes the plurality of switches S11 to S14, S21 to S24, S31 to S34, and S41 to S44.

(5.3) Output Switching Circuit

Next, the circuit configuration of the output switching circuit 17 will be described. As illustrated in FIG. 7, the output switching circuit 17 includes a plurality of (four in the illustrated example) input terminals 171 to 174, a plurality of (four in the illustrated example) switches S51 to S54, an output terminal 170, and a control terminal 175.

The output terminal 170 is connected to the low pass filter 4 (see FIG. 6). The output terminal 170 is a terminal for supplying the low pass filter 4 with a voltage selected from among the voltages V41 to V44.

The plurality of input terminals 171 to 174 are connected to the nodes N4 to N1 of the switched-capacitor circuit 16, respectively. The plurality of input terminals 171 to 174 are terminals for receiving the voltages V44 to V41 from the switched-capacitor circuit 16, respectively.

The control terminal 175 is an input terminal for a digital control signal. Specifically, the control terminal 175 is a terminal for receiving a digital control signal indicating one of the voltages V41 to V44. The output switching circuit 17 controls ON/OFF of the plurality of switches S51 to S54 so as to select a voltage level indicated by the digital control signal.

The digital control signal received via the control terminal 175 includes, for example, two digital control logic/line (DCL) signals. The two DCL signals are each a 1-bit signal. One of the voltages V41 to V44 is indicated by a combination of two 1-bit signals. For example, the voltages V41, V42, V43, and V44 are indicated by "00", "01", "10", and "11", respectively. A gray code may be used to express a voltage level. In the above case, two control terminals are provided to receive two DCL signals. The number of DCL signals may be any number greater than or equal to one in accordance with the number of voltage levels. The DCL signal may be a signal of two or more bits. The digital control signal may be one or more DCL signals, or may be a control signal of the source synchronous scheme.

The switch S51 is connected between the input terminal 171 and the output terminal 170. Specifically, the switch S51 has a first terminal connected to the input terminal 171 and a second terminal connected to the output terminal 170. In this connection configuration, ON/OFF switching of the switch S51 enables switching between connection and disconnection between the input terminal 171 and the output terminal 170.

The switch S52 is connected between the input terminal 172 and the output terminal 170. Specifically, the switch S52 has a first terminal connected to the input terminal 172 and a second terminal connected to the output terminal 170. In this connection configuration, ON/OFF switching of the switch S52 enables switching between connection and disconnection between the input terminal 172 and the output terminal 170.

The switch S53 is connected between the input terminal 173 and the output terminal 170. Specifically, the switch S53 has a first terminal connected to the input terminal 173 and a second terminal connected to the output terminal 170. In this connection configuration, ON/OFF switching of the switch S53 enables switching between connection and disconnection between the input terminal 173 and the output terminal 170.

The switch S54 is connected between the input terminal 174 and the output terminal 170. Specifically, the switch S54 has a first terminal connected to the input terminal 174 and a second terminal connected to the output terminal 170. In this connection configuration, ON/OFF switching of the switch S54 enables switching between connection and disconnection between the input terminal 174 and the output terminal 170.

According to an exemplary aspect, the plurality of switches S51 to S54 are controlled so as to be exclusively turned ON. In other words, only any one of the switches S51 to S54 is turned ON, and the others are turned OFF. Accordingly, the output switching circuit 17 is configured to output one voltage selected from among the voltages V41 to V44.

With the above-described configuration, the output switching circuit 17 receives a digital control signal corresponding to an envelope signal through the control terminal 175, controls ON/OFF of the plurality of switches S51 to S54 in response to the digital control signal received through the control terminal 175, and selects at least one of the plurality of voltages V41 to V44 generated by the switched-capacitor circuit 16. The output switching circuit 17 outputs the selected voltage.

The configuration of the output switching circuit 17 illustrated in FIG. 7 is an example. The configuration of the output switching circuit 17 is not limited to the configuration illustrated in FIG. 7. In particular, the switches S51 to S54 may have any configuration as long as any one of the four input terminals 171 to 174 can be selected and connected to the output terminal 170. For example, the output switching circuit 17 may further include a switch connected between a set of the switches S51 to S53 and a set of the switch S54 and the output terminal 170. For example, the output switching circuit 17 may further include a switch connected between a set of the switches S51 and S52 and a set of the switches S53 and S54 and the output terminal 170.

For example, in the case of selecting one voltage from among voltages of two discrete voltage levels, it is sufficient that the output switching circuit 17 include at least the switches S52 and S53.

The output switching circuit 17 can be configured to output two or more voltages. In this case, it is sufficient that the output switching circuit 17 further include a necessary number of additional switch sets similar to the set of the switches S51 to S54 and additional output terminals.

The switches included in the output switching circuit 17 are included in the tracker component 3. Specifically, the tracker component 3 includes the plurality of switches S51 to S54.

(5.4) Pre-Regulator Circuit

Next, the circuit configuration of the pre-regulator circuit 15 will be described. As illustrated in FIG. 7, the pre-regulator circuit 15 includes an input terminal 150, a plurality of (e.g., four in the illustrated example) output terminals 151 to 154, a plurality of inductor connection terminals 155 and 156, a control terminal 157, a plurality of (e.g., five in the illustrated example) switches S61, S62, S63, S71, and S72, a power inductor L71, and a plurality of capacitors C61, C62, C63, and C64.

The input terminal 150 is an input terminal for a DC voltage. Specifically, the input terminal 150 is a terminal for receiving an input voltage from the DC power supply 18 (see FIG. 6).

The output terminal 151 is an output terminal for the voltage V44. Specifically, the output terminal 151 is a terminal for supplying the voltage V44 to the switched-capacitor circuit 16. The output terminal 151 is connected to the node N4 of the switched-capacitor circuit 16.

The output terminal 152 is an output terminal for the voltage V43. Specifically, the output terminal 152 is a terminal for supplying the voltage V43 to the switched-capacitor circuit 16. The output terminal 152 is connected to the node N3 of the switched-capacitor circuit 16.

The output terminal 153 is an output terminal for the voltage V42. Specifically, the output terminal 153 is a terminal for supplying the voltage V42 to the switched-capacitor circuit 16. The output terminal 153 is connected to the node N2 of the switched-capacitor circuit 16.

The output terminal 154 is an output terminal for the voltage V41. Specifically, the output terminal 154 is a terminal for supplying the voltage V41 to the switched-capacitor circuit 16. The output terminal 154 is connected to the node N1 of the switched-capacitor circuit 16.

The inductor connection terminal 155 is connected to one end (first end) of the power inductor L71. The inductor connection terminal 156 is connected to the other end (second end) of the power inductor L71.

The control terminal 157 is an input terminal for a digital control signal. Specifically, the control terminal 157 is a terminal for receiving a digital control signal for controlling the pre-regulator circuit 15.

The switch S71 is connected between the input terminal 150 and the one end (first end) of the power inductor L71. Specifically, the switch S71 has a first terminal connected to the input terminal 150, and a second terminal connected to the one end of the power inductor L71 via the inductor connection terminal 155. In this connection configuration, ON/OFF switching of the switch S71 enables switching between connection and disconnection between the input terminal 150 and the one end of the power inductor L71.

The switch S72 is connected between the one end (first end) of the power inductor L71 and the ground. Specifically, the switch S72 has a first terminal connected to the one end of the power inductor L71 via the inductor connection terminal 155, and a second terminal connected to the ground. In this connection configuration, ON/OFF switching of the switch S72 enables switching between connection and disconnection between the one end of the power inductor L71 and the ground.

The switch S61 is connected between the other end (second end) of the power inductor L71 and the output terminal 151. Specifically, the switch S61 has a first terminal connected to the other end of power inductor L71, and a second terminal connected to the output terminal 151. In this connection configuration, ON/OFF switching of the switch S61 enables switching between connection and disconnection between the other end of the power inductor L71 and the output terminal 151.

The switch S62 is connected between the other end (second end) of the power inductor L71 and the output terminal 152. Specifically, the switch S62 has a first terminal connected to the other end of power inductor L71, and a second terminal connected to the output terminal 152. In this connection configuration, ON/OFF switching of the switch S62 enables switching between connection and disconnection between the other end of the power inductor L71 and the output terminal 152.

The switch S63 is connected between the other end (second end) of the power inductor L71 and the output terminal 153. Specifically, the switch S63 has a first terminal connected to the other end of power inductor L71, and a second terminal connected to the output terminal 153. In this connection configuration, ON/OFF switching of the switch S63 enables switching between connection and disconnection between the other end of the power inductor L71 and the output terminal 153.

The capacitor C61 is connected between the output terminal 151 and the output terminal 152. One of the two electrodes (first electrode) of the capacitor C61 is connected to the switch S61 and the output terminal 151, and the other of the two electrodes (second electrode) of the capacitor C61 is connected to the switch S62, the output terminal 152, and one of the two electrodes (first electrode) of the capacitor C62.

The capacitor C62 is connected between the output terminal 152 and the output terminal 153. The one of the two electrodes (first electrode) of the capacitor C62 is connected to the switch S62, the output terminal 152, and the other of the two electrodes (second electrode) of the capacitor C61, and the other of the two electrodes (second electrode) of the capacitor C62 is connected to the switch S63, the output terminal 153, and one of the two electrodes of the capacitor C63.

The capacitor C63 is connected between the output terminal 153 and the output terminal 154. The one of the two electrodes (first electrode) of the capacitor C63 is connected to the switch S63, the output terminal 153, and the other of the two electrodes (second electrode) of the capacitor C62, and the other of the two electrodes (second electrode) of the capacitor C63 is connected to the output terminal 154 and one of the two electrodes (first electrode) of the capacitor C64.

The capacitor C64 is connected between the output terminal 154 and the ground. The one of the two electrodes (first electrode) of the capacitor C64 is connected to the output terminal 154 and the other of the two electrodes (second electrode) of the capacitor C63, and the other of the two electrodes (second electrode) of the capacitor C64 is connected to the ground.

The plurality of switches S61 to S63 are controlled so as to be exclusively turned ON. In other words, only any one of the switches S61 to S63 is turned ON, and the others are turned OFF. Turning ON of any one of the switches S61 to S63 enables the levels of the voltages V41 to V44 to be changed.

Moreover, the pre-regulator circuit 15 configured as described above supplies electric charge to the switched-capacitor circuit 16 via at least one of the plurality of output terminals 151 to 154.

The switches included in the pre-regulator circuit 15 are mounted in the tracker component 3. Specifically, the tracker component 3 includes the plurality of switches S61 to S63, S71, and S72.

(6) Constituent Elements of RF Module

Hereinafter, the individual constituent elements of the RF module 5 according to the first embodiment will be described with reference to the drawings.

(6.1) PA Circuit

As illustrated in FIG. 3, the PA circuit 6 includes the PA 61 and a control circuit 62.

The PA circuit 6 is an amplifier circuit that amplifies the power of an RF signal output from an RF signal processing circuit 75, which will be described below, to a level necessary for transmitting the RF signal to a base station (not illustrated), and outputs the amplified RF signal.

(6.1.1) PA

The PA 61 illustrated in FIG. 3 includes, although not illustrated, a transistor (amplifier element), a bias circuit, a resistor, an input matching circuit, and an output matching circuit.

(6.1.2) Transistor

The transistor (not illustrated) of the PA 61 illustrated in FIG. 3 is, for example, an NPN transistor, and is an amplifier element that amplifies an RF signal by being supplied with the power supply voltage V1. The transistor amplifies an RF signal output from the RF signal processing circuit 75. The transistor has a base connected to an output terminal of the input matching circuit (not illustrated). The base of the transistor may be electrically connected to the output terminal of the input matching circuit via a capacitor (not illustrated). The transistor has a collector electrically connected to the low pass filter 4 of the tracker module 1. The transistor has an emitter that is at a ground potential.

The transistor of the PA 61 is supplied with the power supply voltage V1. The base of the transistor receives an RF signal output from the input matching circuit. The base of the transistor is connected to the bias circuit (not illustrated) via the resistor (not illustrated), and a predetermined bias current is superimposed on the RF signal output from the input matching circuit. The tracker module 1 is connected to the collector of the transistor. To the collector of the transistor, the power supply voltage V1 controlled in accordance with the amplitude level of the RF signal is applied from the tracker module 1. The collector of the transistor is connected to the filter 51 via the output matching circuit (not illustrated).

The ET method is used here as described above, and thus the amplitude level of the power supply voltage V1 changes in accordance with amplitude variations of the RF signal.

(6.1.3) Bias Circuit

The bias circuit (not illustrated) of the PA 61 illustrated in FIG. 3 is a circuit for biasing the transistor (not illustrated) of the PA 61 to an operating point. The bias circuit includes, for example, a transistor, such as a heterojunction bipolar transistor (HBT).

Moreover, the bias circuit is connected to the base of the transistor that amplifies an RF signal. More specifically, the bias circuit has an output terminal connected between the output terminal of the input matching circuit (not illustrated) and the base of the transistor. The bias circuit is configured to supply a bias (bias current) to the base of the transistor.

Although not illustrated, for example, a battery voltage supplied from the battery of the communication device 7 or the like equipped with the RF module 5 is applied to the collector of the transistor included in the bias circuit. The emitter of the transistor included in the bias circuit is connected to the base of the transistor that amplifies an RF signal. It is noted that the bias circuit is not limited to the above-described configuration, and can have another configuration as long as it is configured for biasing the transistor that amplifies an RF signal to an operating point.

(6.1.4) Input Matching Circuit

The input matching circuit (not illustrated) of the PA 61 illustrated in FIG. 3 is connected to the input side of the transistor, and serves as a matching circuit for achieving the matching between the output impedance of a circuit on the input side of the transistor (for example, the RF signal processing circuit 75) and the input impedance of the transistor. The input matching circuit includes, for example, at least one of an inductor and a capacitor.

(6.1.5) Output Matching Circuit

The output matching circuit (not illustrated) of the PA 61 illustrated in FIG. 3 is connected to the output side of the transistor, and serves as a matching circuit for achieving the matching between the output impedance of the transistor and the input impedance of a circuit on the output side of the transistor (for example, the filter 51). The output matching circuit includes, for example, at least one of an inductor and a capacitor.

(6.1.6) Control Circuit

As illustrated in FIG. 3, the control circuit 62 controls the PA 61. More specifically, the control circuit 62 controls the bias circuit of the PA 61.

(6.2) Filter

As illustrated in FIG. 3, the filter 51 is a transmission filter of a communication band that allows an RF signal to pass therethrough. The filter 51 is disposed, on a transmission path, between the PA circuit 6 and the antenna terminal 54. More specifically, the filter 51 is disposed on a path between the PA circuit 6 and the switch 52. The filter 51 passes an RF signal having power amplified by the PA circuit 6 and output from the PA circuit 6. The transmission path is a path connecting the input terminal 53 and the antenna terminal 54 to transmit an RF signal from the antenna 71.

The filter 51 is not limited to a transmission filter, and may be a duplexer including both a transmission filter and a reception filter, or may be a multiplexer including three or more filters.

(6.3) Switch

As illustrated in FIG. 3, the switch 52 is a switch for switching the path to be connected to the antenna terminal 54. In other words, the switch 52 is a switch for switching the filter to be connected to the antenna terminal 54 among a plurality of filters including the filter 51.

The switch 52 has a common terminal 521 and a plurality of (two in the illustrated example) selection terminals 522 and 523. The common terminal 521 is connected to the antenna terminal 54. The selection terminal 522 is connected to the filter 51. The selection terminal 523 is connected to another filter (not illustrated) different from the filter 51.

In the exemplary aspect, the switch 52 is, for example, a switch configured to connect any one of the plurality of selection terminals 522 and 523 to the common terminal 521. The switch 52 is, for example, a switch integrated circuit (IC). The switch 52 is, for example, controlled by the signal processing circuit 72, which will be described below. The switch 52 switches the connection state between the common terminal 521 and the plurality of selection terminals 522 and 523 in response to a control signal from the RF signal processing circuit 75 of the signal processing circuit 72. Moreover, the switch 52 can be configured to simultaneously connect the plurality of selection terminals 522 and 523 to the common terminal 521. In this case, the switch 52 is a switch for one-to-many connection.

(6.4) Antenna Terminal

As illustrated in FIG. 3, the antenna terminal 54 is a terminal connected to the antenna 71, which will be described below. An RF signal from the RF module 5 is output to the antenna 71 via the antenna terminal 54. Although not illustrated, an RF signal from the antenna 71 is output to the RF module 5 via the antenna terminal 54.

(7) Constituent Elements of Communication Device

Hereinafter, the individual constituent elements of the communication device 7 according to the first embodiment will be described with reference to the drawings.

(7.1) Antenna

As illustrated in FIG. 3, the antenna 71 is connected to the antenna terminal 54 of the RF module 5. The antenna 71 has a radiation function of radiating an RF signal (e.g., a transmission signal) output from the RF module 5 as a radio wave, and a reception function of receiving an RF signal (e.g., a reception signal) as a radio wave from the outside and outputting the received RF signal to the RF module 5.

(7.2) Signal Processing Circuit

As illustrated in FIG. 3, the signal processing circuit 72 includes a baseband signal processing circuit 74 and the RF signal processing circuit 75. The signal processing circuit 72 outputs an RF signal to the RF module 5.

The baseband signal processing circuit 74 is, for example, a baseband integrated circuit (BBIC), and performs signal processing on an RF signal. The RF signal has a frequency of around several hundred MHz to several GHz, for example.

The baseband signal processing circuit 74 generates an I-phase signal and a Q-phase signal from a baseband signal. The baseband signal is, for example, an audio signal, an image signal, or the like received from the outside. The baseband signal processing circuit 74 combines the I-phase signal and the Q-phase signal to perform IQ modulation processing, and outputs a transmission signal. At this time, the transmission signal is generated as a modulated signal (IQ signal), which is obtained through amplitude modulation performed on a carrier signal of a predetermined frequency in a period longer than the period of the carrier signal. The modulated signal is output as an IQ signal from the baseband signal processing circuit 74. The IQ signal is a signal whose amplitude and phase are represented on an IQ plane. The IQ signal has a frequency of around several MHz to several hundred MHz, for example.

As described above, an envelope signal is a signal indicating the envelope value of a modulated wave (e.g., an RF signal). The envelope value is, for example, $(I^2+Q^2)^{1/2}$. (I, Q) represents a constellation point herein. The constellation point is a point representing, on a constellation diagram, a signal modulated by digital modulation.

The RF signal processing circuit 75 is, for example, a radio frequency integrated circuit (RFIC), and performs signal processing on an RF signal. For example, the RF signal processing circuit 75 performs predetermined signal processing on the modulated signal (IQ signal) output from the baseband signal processing circuit 74. More specifically, the RF signal processing circuit 75 is configured to perform signal processing, such as up-conversion, on the modulated signal output from the baseband signal processing circuit 74, and outputs the RF signal generated through the signal processing to the PA circuit 6. The signal processing performed by the RF signal processing circuit 75 is not limited to direct conversion from the modulated signal into the RF signal. The RF signal processing circuit 75 may convert the modulated signal into an intermediate frequency (IF) signal, and generate an RF signal from the IF signal obtained through the conversion.

The signal processing circuit 72 outputs a power supply control signal to the tracker component 3 of the tracker module 1. The power supply control signal is a signal including information regarding amplitude variations of an RF signal, and is output from the signal processing circuit 72 to the tracker module 1 in order to change the amplitude of the power supply voltage V1. The power supply control signal includes, for example, an I-phase signal and a Q-phase signal.

(8) Operation of Tracker Module

Next, the operation of the tracker module 1 according to the first embodiment will be described with reference to the drawings.

Figure 4:
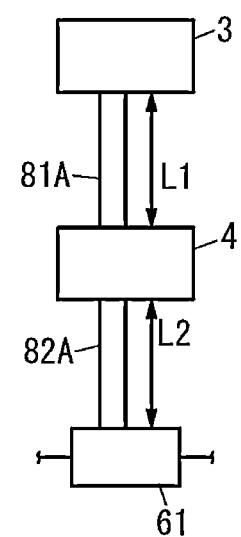
FIG. 4 is a conceptual diagram for describing the details of the tracker module according to the first exemplary embodiment.

As illustrated in FIG. 4, the tracker component 3 outputs the power supply voltage V1. The path 81A between the tracker component 3 and the low pass filter 4 has a first path length L1, which is short, and thus parasitic resistance components, parasitic capacitance components, and inductance components generated in the path 81A can be reduced.

The low pass filter 4 allows the power supply voltage V1 from the tracker component 3 to pass therethrough. The low pass filter 4 reduces harmonic components of the power supply voltage V1. Specifically, the low pass filter 4 cuts harmonic components of the power supply voltage V1 and allows fundamental wave components of the power supply voltage V1 to pass therethrough.

Thereafter, the power supply voltage V1 that has passed through the low pass filter 4 is applied to the PA 61. The path 82A between the low pass filter 4 and the PA 61 has a second path length L2, which is short, and thus parasitic resistance components, parasitic capacitance components, and inductance components generated in the path 82A can be reduced.

Figure 5:
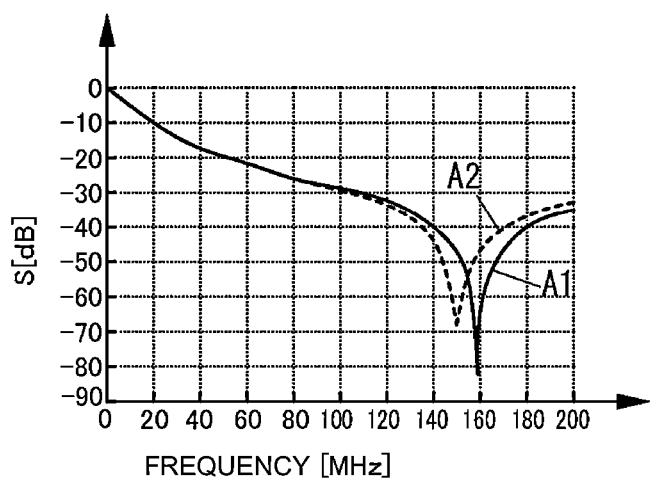
FIG. 5 is a graph illustrating the characteristics of a low pass filter of the tracker module according to the first exemplary embodiment.

As described above, as a result of reducing the parasitic capacitance components and inductance components generated in the paths 81A and 82A, steep attenuation can be obtained at the attenuation pole of the low pass filter 4, as illustrated in FIG. 5 (characteristic A1 in FIG. 5). On the other hand, in a case where the path is long, parasitic capacitance components and inductance components increase, and thus the attenuation at the attenuation pole of the low pass filter 4 is deteriorated by about 10 dB (characteristic A2 in FIG. 5).

(9) Advantageous Effects

In the tracker module 1 according to the first embodiment, the tracker component 3 and the low pass filter 4 are disposed on or in the substrate 2 (i.e., a second substrate) that is separate from the first substrate on or in which the PA 61 is disposed. This disposition shortens the path 81A between the tracker component 3 and the low pass filter 4, and thus reduces parasitic resistance components generated in the path 81A between the tracker component 3 and the low pass filter 4. As a result of reducing the parasitic resistance components, the power consumption of the tracker module 1 can be reduced. That is, the power consumed by the tracker module 1 to supply the power supply voltage V1 to the PA 61 can be reduced.

In the tracker module 1 according to the first embodiment, the low pass filter 4 has a function of reducing harmonic components of the power supply voltage output from the tracker component 3, and the characteristics thereof are determined by an impedance characteristic including the path 81A between the tracker component 3 and the low pass filter 4. The low pass filter 4 is disposed on or in the substrate 2 (i.e., a second substrate), and thus an effect of the low pass filter 4 can be stably obtained regardless of the positional relationship between the first substrate and the second substrate.

In the tracker module 1 according to the first embodiment, the tracker component 3 and the low pass filter 4 are integrated together into one package. This configuration further reduces parasitic resistance components generated in the path 81A between the tracker component 3 and the low pass filter 4. As a result of further reducing the parasitic resistance components, the power consumption of the tracker module 1 (e.g., the power consumed to supply the power supply voltage V1 to the PA 61) can be further reduced.

In the tracker module 1 according to the first embodiment, the tracker component 3 is disposed adjacent to the low pass filter 4 on or in the substrate 2. This disposition further shortens the path 81A between the tracker component 3 and the low pass filter 4, and thus further reduces parasitic resistance components generated in the path 81A between the tracker component 3 and the low pass filter 4. As a result of further reducing the parasitic resistance components, the power consumption of the tracker module 1 (e.g., the power consumed to supply the power supply voltage V1 to the PA 61) can be further reduced.

In the tracker module 1 according to the first embodiment, the PA connection terminal 24 overlaps the low pass filter 4 in plan view in the thickness direction of the substrate 2 (i.e., a second substrate). This disposition shortens the path between the low pass filter 4 and the PA connection terminal 24, that is, the path 82A between the low pass filter 4 and the PA 61, and thus reduces parasitic resistance components generated in the path 82A between the low pass filter 4 and the PA 61. As a result of reducing the parasitic resistance components, the power consumption of the tracker module 1 (e.g., the power consumed to supply the power supply voltage V1 to the PA 61) can be further reduced.

In the tracker module 1 according to the first embodiment, the low pass filter 4 reduces harmonic components of the power supply voltage V1. Accordingly, noise resulting from the power supply voltage V1 can be reduced.

MODIFICATIONS

Hereinafter, modifications of the first exemplary embodiment will be described.

First Modification

Figure 8:
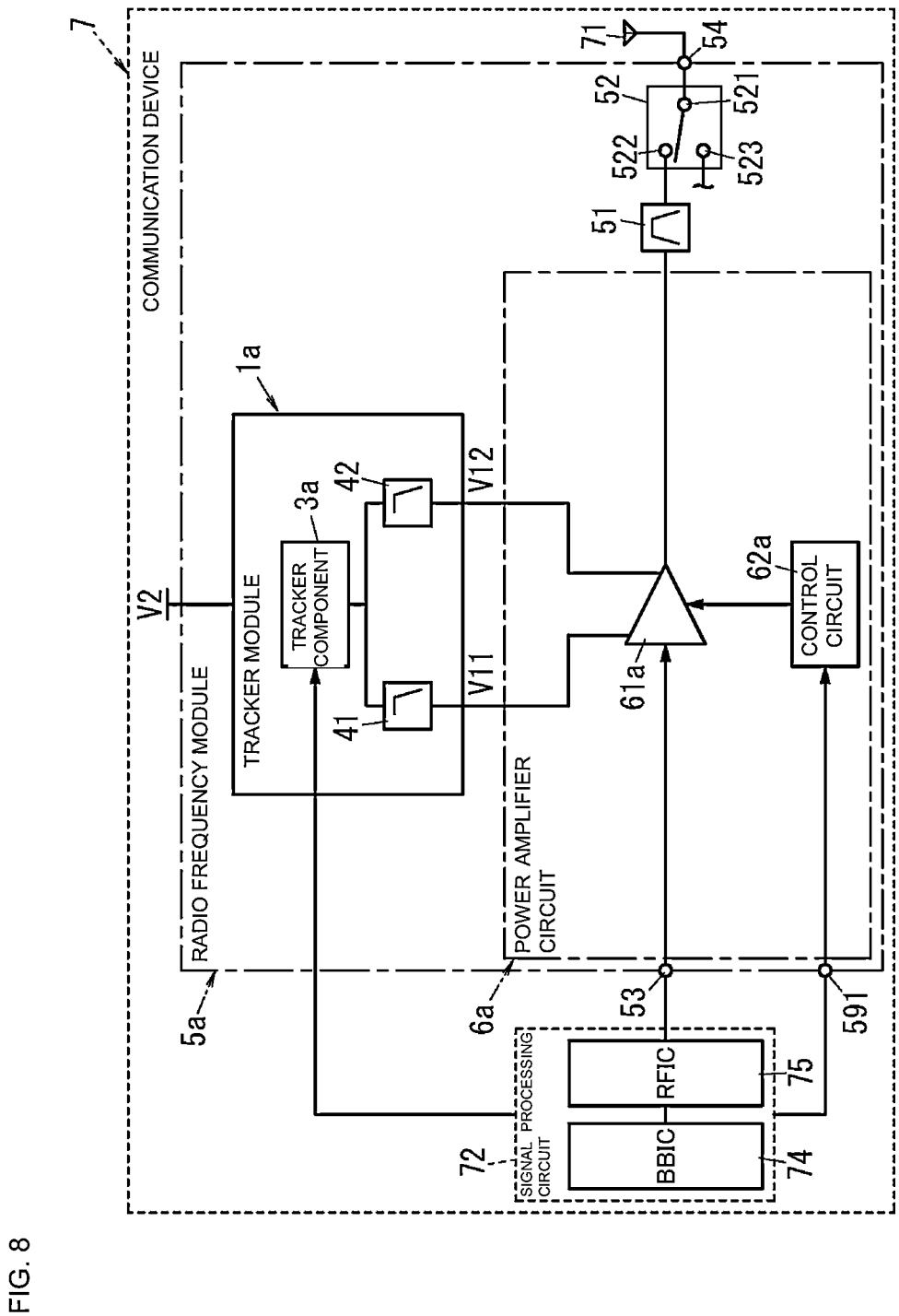
FIG. 8 is a conceptual diagram illustrating the configurations of a tracker module, a PA module, an RF module, and a communication device according to a first modification of the first exemplary embodiment.

As illustrated in FIG. 8, an RF module 5a according to a first modification of the first exemplary embodiment includes a tracker module 1a, a PA circuit 6a, the filter 51, the switch 52, the input terminal 53, and the antenna terminal 54.

As illustrated in FIG. 8, the tracker module 1a includes a tracker component 3a and a plurality of (e.g., two in the illustrated example) low pass filters 41 and 42.

The tracker component 3a is configured to supply power supply voltages V11 and V12 to a PA 61a, similarly to the tracker component 3 of the first embodiment. The tracker component 3a outputs the power supply voltage V11 to the low pass filter 41 and outputs the power supply voltage V12 to the low pass filter 42.

As illustrated in FIG. 8, the PA circuit 6a includes the PA 61a and a control circuit 62a.

The PA 61a illustrated in FIG. 8 includes, although not illustrated, a plurality of (for example, two) transistors (amplifier elements), a plurality of (for example, two) bias circuits, a plurality of (for example, two) resistors, an input matching circuit, an output matching circuit, and a matching circuit. The plurality of transistors include a first transistor (not illustrated) and a second transistor (not illustrated). The plurality of bias circuits include a first bias circuit (not illustrated) and a second bias circuit (not illustrated). The plurality of resistors include a first resistor (not illustrated) and a second resistor (not illustrated).

The first transistor (not illustrated) is supplied with the power supply voltage V11. The first transistor has a base that receives an RF signal output from the input matching circuit. The base of the first transistor is connected to the first bias circuit via the first resistor, and a predetermined bias current is superimposed on the RF signal output from the input matching circuit. The first transistor has a collector connected to the tracker module 1a. To the collector of the first transistor, the power supply voltage V11 controlled in accordance with the amplitude level of the RF signal is applied from the tracker module 1a. The collector of the first transistor is connected to the second transistor (not illustrated) via the matching circuit (not illustrated).

The second transistor (not illustrated) is supplied with the power supply voltage V12. The second transistor has a base that receives an RF signal output from the matching circuit. The base of the second transistor is connected to the second bias circuit via the second resistor, and a predetermined bias current is superimposed on the RF signal output from the matching circuit. The second transistor has a collector connected to the tracker module 1a. To the collector of the second transistor, the power supply voltage V12 controlled in accordance with the amplitude level of the RF signal is applied from the tracker module 1a. The collector of the second transistor is connected to the filter 51 via the output matching circuit (not illustrated).

The first bias circuit (not illustrated) of the PA 61a illustrated in FIG. 8 is a circuit for biasing the first transistor (not illustrated) to an operating point. The second bias circuit (not illustrated) of the PA 61a illustrated in FIG. 8 is a circuit for biasing the second transistor (not illustrated) to an operating point.

The second bias circuit (not illustrated) is connected to the base of the second transistor (not illustrated). More specifically, the second bias circuit has an output terminal connected between an output terminal of the matching circuit (not illustrated) and the base of the second transistor. The second bias circuit is configured to supply a bias (bias current) to the base of the second transistor.

The matching circuit (not illustrated) of the PA 61a is disposed between the first transistor and the second transistor, and serves as a matching circuit for achieving the matching between the output impedance of the first transistor and the input impedance of the second transistor. The matching circuit includes, for example, at least one of an inductor and a capacitor.

As illustrated in FIG. 8, the control circuit 62a controls the PA 61a. More specifically, the control circuit 62a controls the plurality of bias circuits of the PA 61a.

(2) Second Modification

Figure 9:
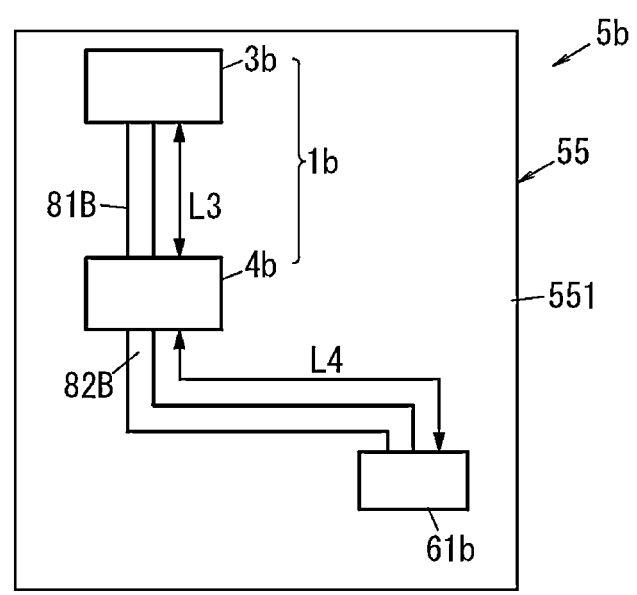
FIG. 9 is a conceptual diagram illustrating the configuration of a tracker module according to a second modification of the first exemplary embodiment.

In a second modification of the first exemplary embodiment, a tracker module 1b (an RF module 5b) may have the configuration illustrated in FIG. 9. In particular, the tracker module 1b according to the second modification includes a tracker component 3b and a low pass filter 4b. The tracker component 3b outputs the power supply voltage V1 for a PA 61b. The low pass filter 4b is connected to an output terminal of the tracker component 3b.

On a main surface 551 of a mounting substrate 55, a first path length L3 of a path 81B between the tracker component 3b and the low pass filter 4b is shorter than a second path length L4 of a path 82B between the low pass filter 4b and the PA 61b.

In the tracker module 1b according to the second modification, the first path length L3 of the path 81B between the tracker component 3b and the low pass filter 4b is shorter than the second path length L4 of the path 82B between the low pass filter 4b and the PA 61b. This configuration reduces parasitic resistance components generated in the path 81B between the tracker component 3b and the low pass filter 4b. As a result of reducing the parasitic resistance components, the power consumption of the tracker module 1b (e.g., the power consumed by the tracker module 1b to supply the power supply voltage V1 to the PA 61b) is also reduced.

According to the exemplary aspect, the relationship between the first path length L3 of the path 81B between the tracker component 3b and the low pass filter 4b and the second path length L4 of the path 82B between the low pass filter 4b and the PA 61b is not limited to the above-described relationship. The first path length L3 of the path 81B between the tracker component 3b and the low pass filter 4b may be longer than the second path length L4 of the path 82B between the low pass filter 4b and the PA 61b.

(3) Other Modifications

In a modification of the first exemplary embodiment, in the tracker module 1, the tracker component 3 and the low pass filter 4 may be separated from each other.

In another modification of the first exemplary embodiment, in the tracker module 1, the low pass filter 4 is disposed on or in the substrate 2, with at least one electronic component interposed between the low pass filter 4 and the tracker component 3.

In the low pass filter 4, two electronic components 401 and 402 of the plurality of electronic components 401 to 404 included in the low pass filter 4 need not necessarily be disposed adjacent to the tracker component 3. Only one of the plurality of electronic components 401 to 404 may be disposed adjacent to the tracker component 3, or three of the plurality of electronic components 401 to 404 may be disposed adjacent to the tracker component 3. Alternatively, all of the plurality of electronic components 401 to 404 may be disposed adjacent to the tracker component 3. In short, it is sufficient that at least one of the plurality of electronic components 401 to 404 included in the low pass filter 4 be disposed adjacent to the tracker component 3.

It is noted that the low pass filter 4 need not necessarily be formed by the plurality of (e.g., four) electronic components 401 to 404. Instead, the low pass filter 4 can be formed by a single chip. Alternatively, the low pass filter 4 can be formed by two or three electronic components or five or more electronic components. Also in these cases, it is sufficient that at least one of the plurality of electronic components included in the low pass filter 4 be disposed adjacent to the tracker component 3.

In an exemplary aspect, the PA circuit 6 can be configured as a PA module. The PA module includes the tracker module 1 and the PA 61.

Moreover, the PA 61 is driven by the power supply voltage V1 output from the tracker module 1 to amplify an RF signal.

In the PA module according to the present modification, the tracker component 3 and the low pass filter 4 are disposed in the tracker module 1. This disposition shortens the path 81A between the tracker component 3 and the low pass filter 4, and thus reduces parasitic resistance components generated in the path 81A between the tracker component 3 and the low pass filter 4. As a result of reducing the parasitic resistance components, the power consumption of the tracker module 1 (e.g., the power consumed by the tracker module 1 to supply the power supply voltage V1 to the PA 61) can be reduced.

Second Exemplary Embodiment

Figure 10:
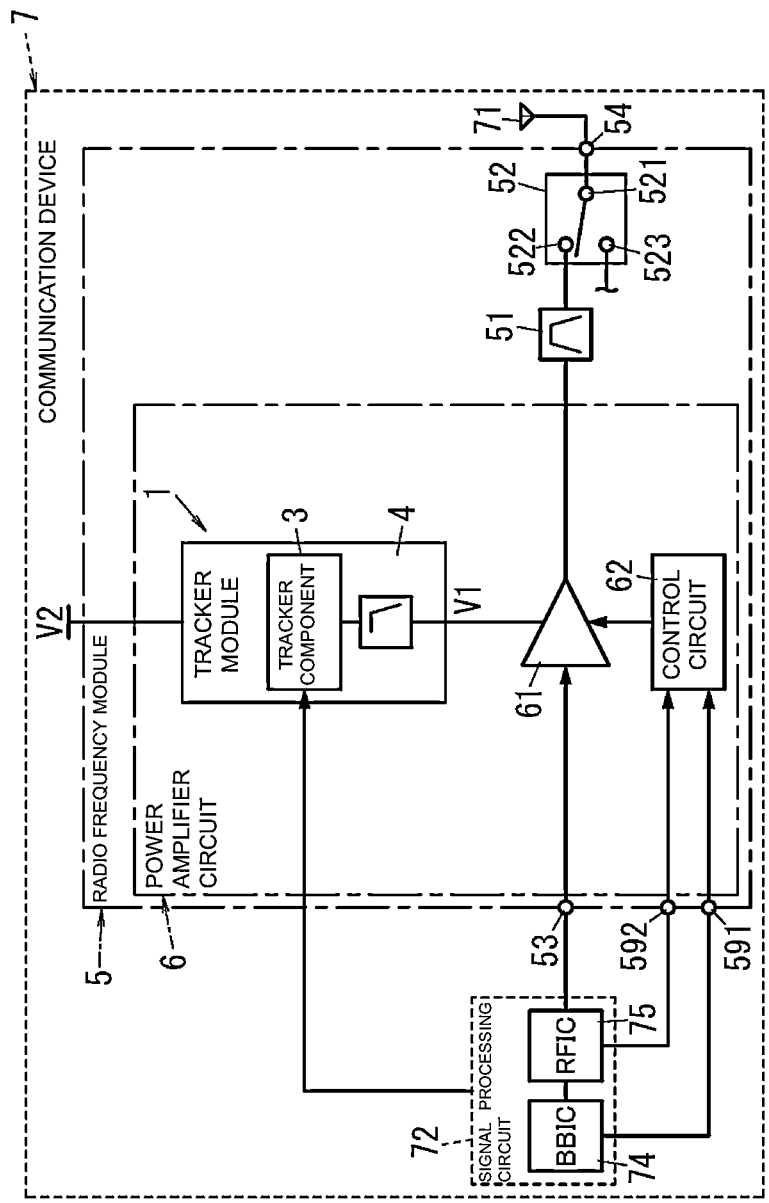
FIG. 10 is a conceptual diagram illustrating the configurations of a PA circuit, an RF module, and a communication device according to a second exemplary embodiment.

A PA circuit 6 according to a second exemplary embodiment is different from the PA circuit 6 according to the first embodiment (see FIG. 3) in that a power supply control signal is input as a digital signal directly from a signal processing circuit 72, as illustrated in FIG. 10. Regarding the PA circuit 6 according to the second embodiment, the constituent elements similar to those of the PA circuit 6 according to the first embodiment are denoted by the same reference numerals, and the description thereof will be omitted.

Configuration

As illustrated in FIG. 10, an RF module 5 according to the second embodiment includes the PA circuit 6, a filter 51, a switch 52, an input terminal 53, an antenna terminal 54, a first terminal 591, and a second terminal 592. The PA circuit 6 includes a tracker module 1, a PA 61, and a control circuit 62, similarly to the PA circuit 6 according to the first embodiment (see FIG. 3). A communication device 7 according to the second embodiment includes the RF module 5, an antenna 71, and the signal processing circuit 72, similarly to the communication device 7 according to the first embodiment (see FIG. 3).

First Terminal

As illustrated in FIG. 10, the first terminal 591 is a terminal connected to the signal processing circuit 72. A mobile industry processor interface (MIPI) signal (e.g., serial data signal) is input to the first terminal 591 from the signal processing circuit 72. The MIPI signal includes information based on the MIPI standard (e.g., serial data transmission standard). The MIPI signal input to the first terminal 591 is output to the control circuit 62.

Second Terminal

As illustrated in FIG. 10, the second terminal 592 is a terminal connected to the signal processing circuit 72. A digital signal is input to the second terminal 592 from the signal processing circuit 72. The digital signal is a signal different from the MIPI signal. The digital signal is a signal including information regarding amplitude variations of an RF signal and is, for example, a signal based on the IQ signal output from the signal processing circuit 72 to the tracker module 1. For example, the digital signal is a signal based on an envelope signal representing the envelope of the amplitude of an RF signal. The digital signal input to the second terminal 592 is output to the control circuit 62. The digital signal input to the second terminal 592 is based on a communication scheme different from that of the serial data signal.

Control Circuit

The control circuit 62 of the second embodiment controls the PA 61 in response to a digital signal input via the second terminal 592, as illustrated in FIG. 10.

(2) Advantageous Effects

In the PA circuit 6 according to the second embodiment, the control circuit 62 controls the PA 61 in response to a digital signal input to the second terminal 592. This further reduces power consumption while dealing with high frequencies.

Third Exemplary Embodiment

Figure 11:
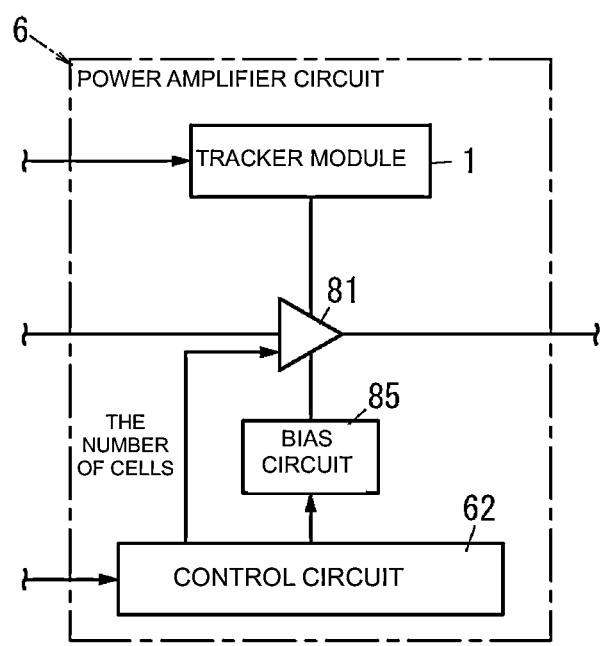
FIG. 11 is a schematic diagram illustrating the configuration of a PA circuit according to a third exemplary embodiment.

A PA circuit 6 according to a third exemplary embodiment is different from the PA circuit 6 according to the second embodiment (see FIG. 10) in terms of controlling the number of cells of an amplifier circuit 81 in response to a digital signal input to the second terminal 592 (see FIG. 10), as illustrated in FIG. 11. Regarding the PA circuit 6 according to the third embodiment, the constituent elements similar to those of the PA circuit 6 according to the second embodiment are denoted by the same reference numerals, and the description thereof will be omitted.

Configuration

As illustrated in FIG. 11, the PA circuit 6 according to the third embodiment includes a tracker module 1, the amplifier circuit 81, and a control circuit 62. Although not illustrated, an RF module according to the third embodiment includes the PA circuit 6, the filter 51 (see FIG. 10), the switch 52 (see FIG. 10), and the antenna terminal 54 (see FIG. 10), similarly to the RF module 5 according to the second embodiment (see FIG. 10). Although not illustrated, a communication device according to the third embodiment includes the RF module, the antenna 71 (see FIG. 10), and the signal processing circuit 72 (see FIG. 10), similarly to the communication device 7 according to the second embodiment (see FIG. 10).

Figure 12:
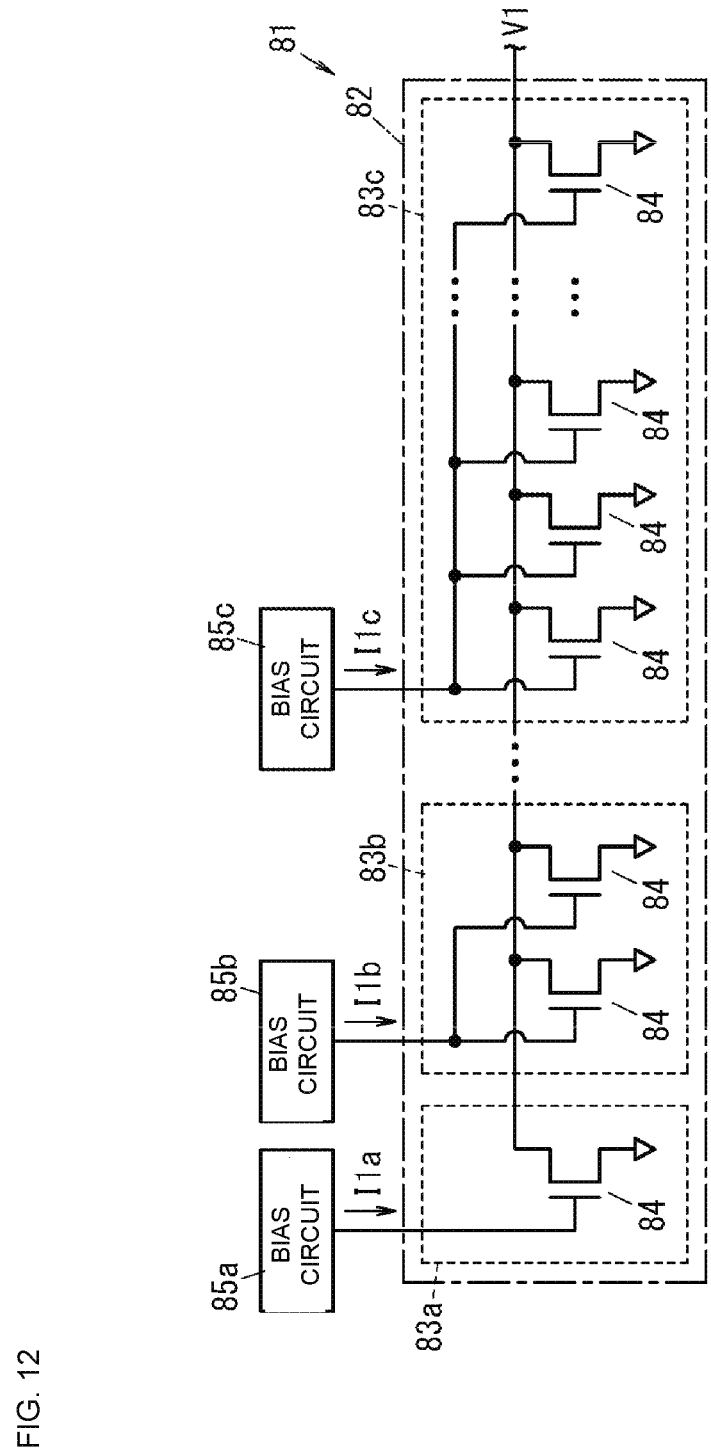
FIG. 12 is a circuit diagram illustrating the configuration of a transistor of the PA circuit according to the third exemplary embodiment.

As illustrated in FIG. 12, the amplifier circuit 81 includes an amplifier transistor 82 and a plurality of bias circuits 85a to 85c. The amplifier transistor 82 includes a plurality of cell transistors 83a to 83c having sizes different from each other.

Next, a description will be given of the configuration of a main part for switching the effective size of the amplifier transistor 82 in the amplifier circuit 81.

As illustrated in FIG. 12, the amplifier transistor 82 includes the plurality of cell transistors 83a to 83c having sizes different from each other.

The individual cell transistors 83a to 83c include sub-transistors 84 of different numbers. All the sub-transistors 84 may have the same size. Accordingly, the effective sizes of the cell transistors 83a to 83c are determined in accordance with the numbers of sub-transistors 84 included therein.

The effective sizes of the cell transistors 83a to 83c may be determined in accordance with the sizes of the sub-transistors 84 included therein. In other words, the sizes of the sub-transistors 84 may vary for each of the cell transistors 83a to 83c, and the effective sizes of the respective cell transistors 83a to 83c may be determined accordingly. In this case, the effective sizes of the cell transistors 83a to 83c are different from each other even if the cell transistors 83a to 83c each include the same number of sub-transistors 84.

The size of each sub-transistor 84 is an emitter area in the case of a bipolar transistor, and is an opposing area between the drain and the source in the case of a field-effect transistor. The sizes of the cell transistors 83a to 83c are the sums of the sizes of the sub-transistors 84 included in the cell transistors 83a to 83c.

Moreover, in the exemplary aspect, the sub-transistors 84 included in the cell transistors 83a to 83c are driven in units of the cell transistors 83a to 83c in accordance with bias currents I1a to I1c supplied from the bias circuits 85a to 85c, respectively. The effective size of the amplifier transistor 82 is switched in accordance with the number and combination of the cell transistors 83a to 83c that are driven.

Figure 13:
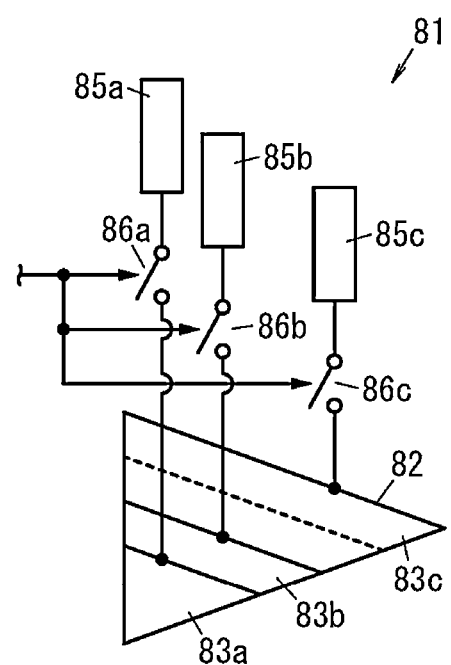
FIG. 13 is a circuit diagram illustrating the configuration of bias circuits of the PA circuit according to the third exemplary embodiment.

As illustrated in FIG. 13, the bias circuits 85a to 85c are connected to the cell transistors 83a to 83c via switches 86a to 86c, respectively. The switches 86a to 86c may be disposed inside the bias circuits 85a to 85c, respectively.

In the example in FIG. 13, switching between ON and OFF of the switches 86a to 86c is performed in response to a bias selection signal. Accordingly, the output power of the PA circuit 6 is adjusted. In addition, each of the bias circuits 85a to 85c included in the amplifier circuit 81 may individually switch between supply and stop of a bias current in response to a control signal (not illustrated), for example. Accordingly, the cell transistors 83a to 83c included in the amplifier circuit 81 are individually driven and stopped, and thus the output power of the PA circuit 6 is finely adjusted.

Driving of all the cell transistors 83a to 83c of the amplifier circuit 81 in response to a bias selection signal obtains maximum output power in the PA circuit 6. Driving of only a necessary number of the cell transistors 83a to 83c in the amplifier circuit 81 obtains lower output power.

(2) Advantageous Effects

In the PA circuit 6 according to the third embodiment, only cell transistors of a desired size and number among the cell transistors 83a to 83c included in the amplifier transistor 82 of the desired amplifier circuit 81 can be driven in accordance with the bias currents supplied from the bias circuits 85a to 85c disposed in the amplifier circuit 81. In other words, all the cell transistors 83a to 83c of the amplifier circuit 81 can be driven to obtain high output power, and only a necessary number of the cell transistors 83a to 83c of the amplifier circuit 81 can be driven to obtain lower output power. As a result, the effective total size of the amplifier transistor 82 can be finely adjusted to optimize current consumption, and the PA circuit 6 having excellent efficiency and gain in a wide range of output power can be obtained.

Fourth Exemplary Embodiment

Figure 14:
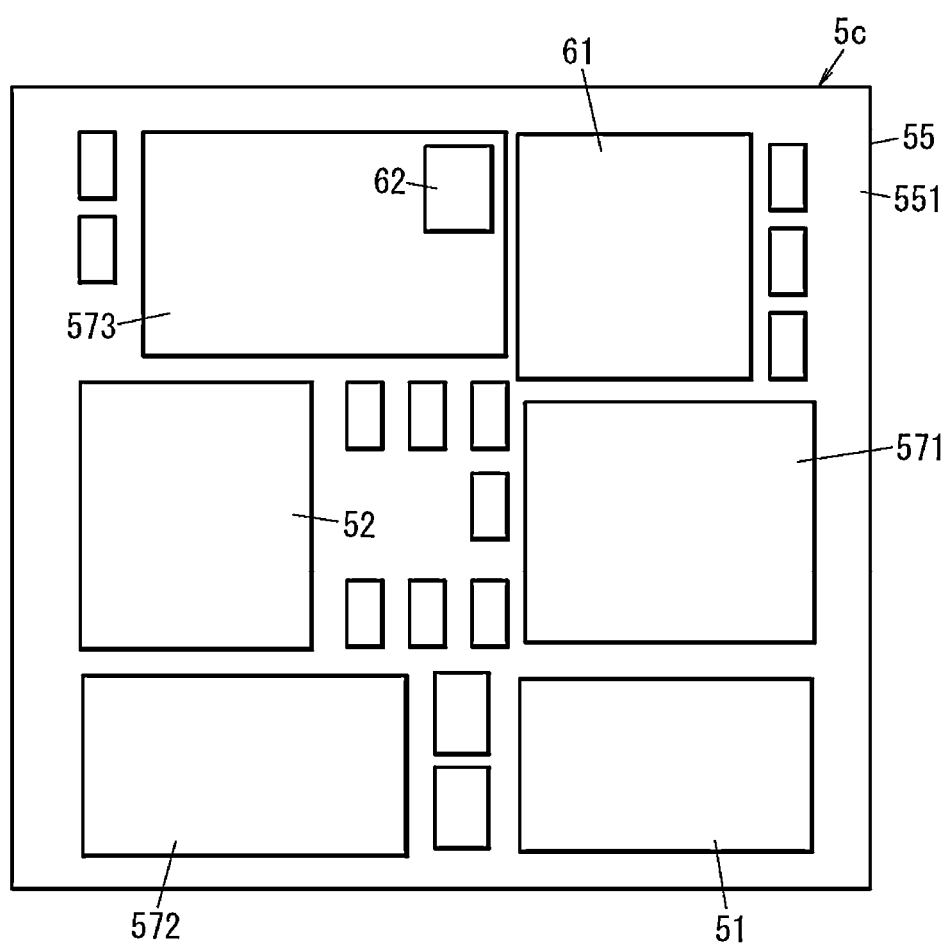
FIG. 14 is a plan view of an RF module according to a fourth exemplary embodiment.
Figure 15:
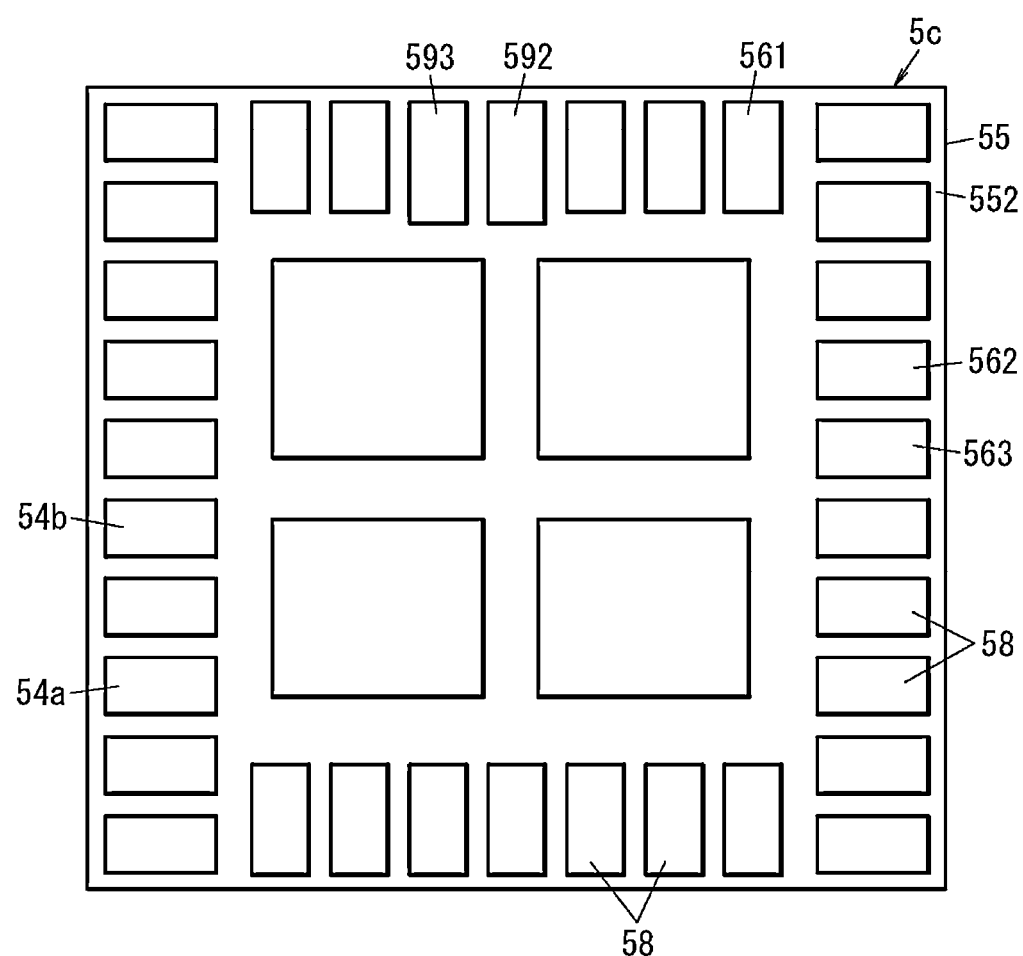
FIG. 15 is a perspective view of the RF module according to the fourth exemplary embodiment.

In a fourth exemplary embodiment, an RF module 5c illustrated in FIG. 14 and FIG. 15 will be described.
Configuration As illustrated in FIG. 14 and FIG. 15, the RF module 5c according to the fourth embodiment includes a mounting substrate 55, a signal input terminal 561, a plurality of (e.g., two in the illustrated example) power supply voltage terminals 562 and 563, a matching component 571, a low-noise amplifier 572, a PA 61, a control component 573, a plurality of (e.g., two in the illustrated example) second terminals 592 and 593, a filter 51, a switch 52, and a plurality of (e.g., two in the illustrated example) antenna terminals 54a and 54b.
Mounting Substrate As illustrated in FIG. 14 and FIG. 15, the mounting substrate 55 has a first main surface 551 and a second main surface 552. The first main surface 551 and the second main surface 552 are opposed to each other in the thickness direction of the mounting substrate 55. The second main surface 552 is opposed to an external substrate (not illustrated) when the RF module 5c is disposed on the external substrate. The mounting substrate 55 is a double-sided mounting substrate having electronic components mounted on each of the first main surface 551 and the second main surface 552.

The mounting substrate 55 is a multilayer substrate including a plurality of dielectric layers laminated one on top of another. The mounting substrate 55 includes a plurality of conductive layers and a plurality of via conductors (including through electrodes). The plurality of conductive layers include a ground layer having a ground potential. The plurality of via conductors are used for electrical connection between the elements mounted on each of the first main surface 551 and the second main surface 552 and the conductive layers of the mounting substrate 55. The plurality of via conductors are used for electrical connection between the elements mounted on the first main surface 551 and the elements mounted on the second main surface 552, and for electrical connection between the conductive layers of the mounting substrate 55 and external connection terminals 58. The plurality of external connection terminals 58 are disposed on the second main surface 552 of the mounting substrate 55.
Power Supply Voltage Terminals As illustrated in FIG. 15, the plurality of power supply voltage terminals 562 and 563 are disposed on or in the mounting substrate 55. More specifically, the plurality of power supply voltage terminals 562 and 563 are disposed on the second main surface 552 of the mounting substrate 55.
Matching Component As illustrated in FIG. 14, the matching component 571 is disposed on or in the mounting substrate 55. More specifically, the matching component 571 is disposed on the first main surface 551 of the mounting substrate 55.
Low-Noise Amplifier As illustrated in FIG. 14, the low-noise amplifier 572 is disposed on or in the mounting substrate 55. More specifically, the low-noise amplifier 572 is disposed on the first main surface 551 of the mounting substrate 55.

The low-noise amplifier 572 has an input terminal and an output terminal. The low-noise amplifier 572 is disposed on a reception path connected to a signal output terminal. The low-noise amplifier 572 amplifies a received signal in a predetermined frequency band input to the input terminal, and outputs the amplified signal from the output terminal. The output terminal of the low-noise amplifier 572 is connected to the signal output terminal. Thus, the output terminal of the low-noise amplifier 572 is connected to the signal processing circuit 72 via the signal output terminal.
PA As illustrated in FIG. 14, the PA 61 is disposed on or in the mounting substrate 55. More specifically, the PA 61 is disposed on the first main surface 551 of the mounting substrate 55.

The PA 61 is disposed on a transmission path. The PA 61 amplifies a transmission signal received from the signal processing circuit 72, and outputs the amplified signal. More specifically, the PA 61 amplifies a transmission signal in a predetermined frequency band received from the signal processing circuit 72, and outputs the amplified signal.

The PA 61 has an input terminal and an output terminal. The input terminal of the PA 61 is connected to the signal input terminal 561. Thus, the input terminal of the PA 61 is connected to the signal processing circuit 72 via the signal input terminal 561. The output terminal of the PA 61 is connected to the filter 51.

Control Component

As illustrated in FIG. 14, the control component 573 is disposed on or in the mounting substrate 55. More specifically, the control component 573 is disposed on the first main surface 551 of the mounting substrate 55. The control component 573 includes the control circuit 62.

Second Terminals

As illustrated in FIG. 15, the plurality of second terminals 592 and 593 are disposed on or in the mounting substrate 55. More specifically, the plurality of second terminals 592 and 593 are disposed on the second main surface 552 of the mounting substrate 55. Digital signals input to the plurality of second terminals 592 and 593 are signals for controlling the PA 61 that amplifies the power of an RF signal.

The plurality of second terminals 592 and 593 are adjacent to each other on or in the mounting substrate 55. This arrangement reduces variation of the wiring length, and thus a rapid change of a digital signal can be realized.

Filter

As illustrated in FIG. 14, the filter 51 is disposed on or in the mounting substrate 55. More specifically, the filter 51 is disposed on the first main surface 551 of the mounting substrate 55.

Switch

As illustrated in FIG. 14, the switch 52 is disposed on or in the mounting substrate 55. More specifically, the switch 52 is disposed on the first main surface 551 of the mounting substrate 55.

Antenna Terminals

As illustrated in FIG. 15, the plurality of antenna terminals 54a and 54b are disposed on or in the mounting substrate 55. More specifically, the plurality of antenna terminals 54a and 54b are disposed on the second main surface 552 of the mounting substrate 55. The plurality of antenna terminals 54a and 54b are terminals through which RF signals pass.

(2) Advantageous Effects

In the RF module 5c according to the fourth embodiment, the plurality of second terminals 592 and 593 are adjacent to each other. This arrangement reduces variation of the wiring length, and thus a rapid change of a digital signal can be realized.

Fifth Exemplary Embodiment

Figure 16:
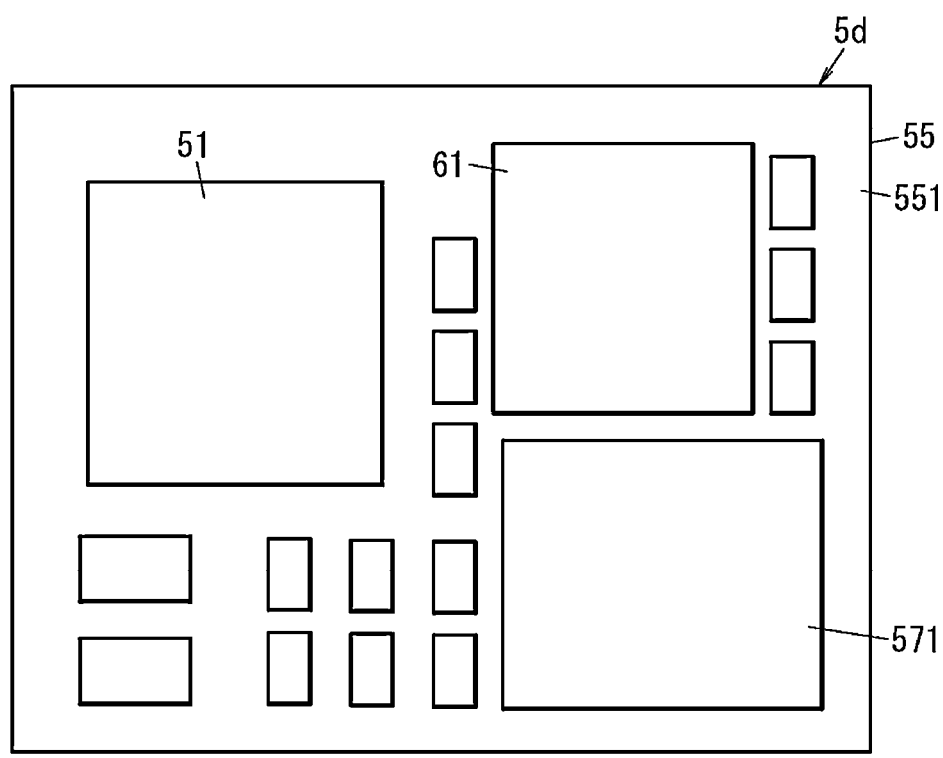
FIG. 16 is a plan view of an RF module according to a fifth exemplary embodiment.
Figure 17:
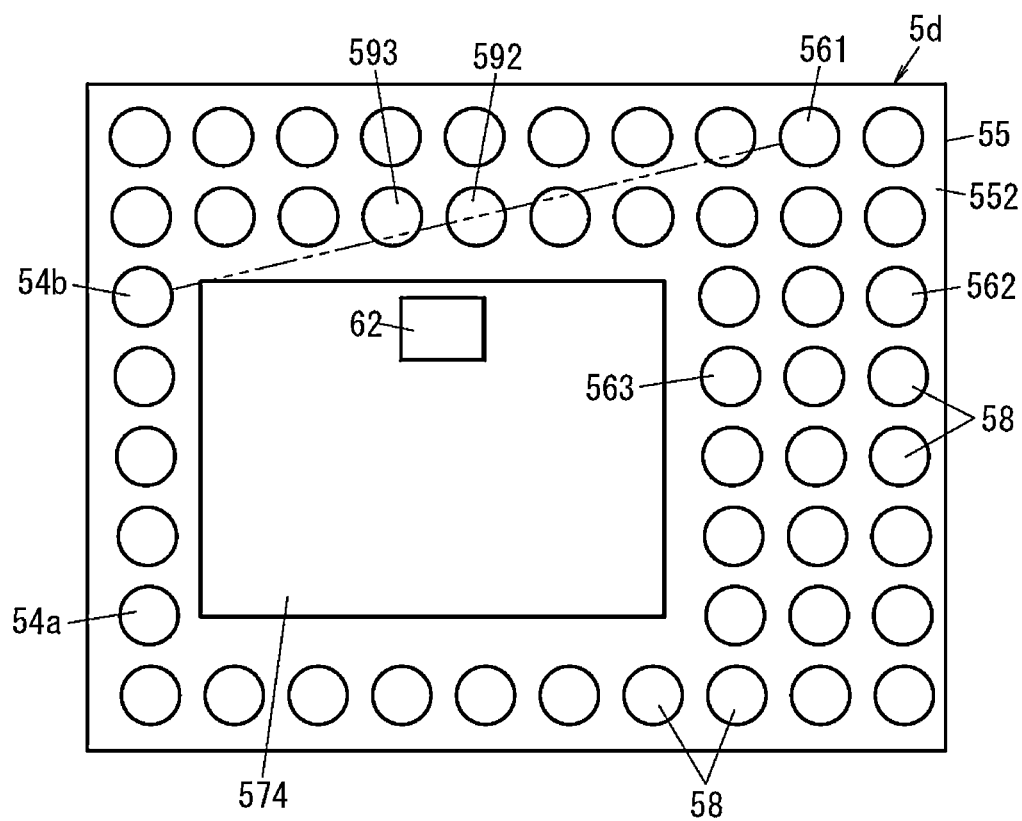
FIG. 17 is a perspective view of the RF module according to the fifth exemplary embodiment.

An RF module 5d according to a fifth exemplary embodiment is different from the RF module 5c according to the fourth embodiment (see FIG. 14 and FIG. 15) in that an IC chip 574 is disposed on a second main surface 552 of a mounting substrate 55, as illustrated in FIG. 16 and FIG. 17. Regarding the RF module 5d according to the fifth embodiment, the constituent elements similar to those of the RF module 5c according to the fourth embodiment are denoted by the same reference numerals, and the description thereof will be omitted.

Configuration

As illustrated in FIG. 16 and FIG. 17, the RF module 5d according to the fifth embodiment includes the mounting substrate 55, a signal input terminal 561, a plurality of (e.g., two in the illustrated example) power supply voltage terminals 562 and 563, a matching component 571, the IC chip 574, a PA 61, a plurality of (e.g., two in the illustrated example) second terminals 592 and 593, a filter 51, and a plurality of (e.g., two in the illustrated example) antenna terminals 54a and 54b.

IC Chip

As illustrated in FIG. 17, the IC chip 574 is disposed on or in the mounting substrate 55. More specifically, the IC chip 574 is disposed on the second main surface 552 of the mounting substrate 55.

The IC chip 574 includes the control circuit 62. The IC chip 574 also includes a low-noise amplifier and the switch 52 (see FIG. 3). In other words, the IC chip 574 is a component including the control circuit 62, the low-noise amplifier, and the switch 52 integrated together.

Second Terminals

The second terminals 592 and 593 are disposed adjacent to the control circuit 62 on or in the mounting substrate 55. More specifically, the second terminals 592 and 593 are disposed adjacent to the control circuit 62 on the second main surface 552 of the mounting substrate 55. This arrangement reduces the wiring length between the second terminals 592 and 593 and the control circuit 62.

The second terminals 592 and 593 are located between two signal terminals in plan view in the thickness direction of the mounting substrate 55. In the example in FIG. 17, the second terminals 592 and 593 are located between the signal input terminal 561 (e.g., a signal terminal) and the antenna terminal 54b (e.g., a signal terminal) in plan view in the thickness direction of the mounting substrate 55. With this arrangement, signal interference between the signal terminals can be reduced in a limited space because the second terminals 592 and 593 are digital terminals that are resistant to noise. For purposes of this disclosure, the phrase "the second terminals 592 and 593 are located between two signal terminals in plan view in the thickness direction of the mounting substrate 55" means that at least one of a plurality of line segments connecting a certain point in one of the two signal terminals (e.g., a first signal terminal) and a certain point in the other of the two signal terminals (e.g., a second signal terminal) passes through the regions of the second terminals 592 and 593 in plan view in the thickness direction of the mounting substrate 55. In addition, the phrase "plan view in the thickness direction of the mounting substrate 55" means that the electronic components and the terminals disposed on or in the mounting substrate 55 are orthogonally projected and viewed on a plane parallel to the main surfaces of the mounting substrate 55.

(2) Advantageous Effects

In the RF module 5d according to the fifth embodiment, the plurality of second terminals 592 and 593 are disposed adjacent to the control circuit 62. This arrangement reduces the wiring length between the plurality of second terminals 592 and 593 and the control circuit 62.

In the RF module 5d according to the fifth embodiment, the second terminals 592 and 593 are digital terminals (e.g., terminals to which digital signals are input) and are thus resistant to noise. Thus, signal interference between signal terminals (for example, between the signal input terminal 561 and the antenna terminal 54b) can be reduced in a limited space.

In general, it is noted that the embodiments and modifications described above are merely some of various embodiments and modifications of the present invention. The embodiments and modifications can be variously changed according to design or the like as long as the object of the present invention can be achieved.

EXEMPLARY ASPECTS

The specification discloses the following aspects.

A tracker module (1; 1a; 1b) according to a first exemplary aspect includes a second substrate (substrate 2) that is separate from a first substrate, a tracker component (3; 3a; 3b), and a low pass filter (4; 41; 42; 4b). A power amplifier (61; 61a) is disposed on or in the first substrate. The tracker component (3; 3a; 3b) is configured to supply a power supply voltage (V1; V11; V12) to the power amplifier (61; 61a). The low pass filter (4; 41; 42; 4b) is disposed on a path between an output terminal of the tracker component (3; 3a; 3b) and the power amplifier (61; 61a). Moreover, the tracker component (3; 3a; 3b) and the low pass filter (4; 41; 42; 4b) are disposed on or in the second substrate.

With the tracker module (1; 1a; 1b) according to the first exemplary aspect, a path (81A; 81B) between the tracker component (3; 3a; 3b) and the low pass filter (4; 41; 42; 4b) can be shortened, and thus parasitic resistance components generated in the path (81A; 81B) between the tracker component (3; 3a; 3b) and the low pass filter (4; 41; 42; 4b) are reduced. As a result of reducing the parasitic resistance components, the power consumption of the tracker module (1; 1a; 1b) is also reduced.

In the tracker module (1; 1a; 1b) according to the first exemplary aspect, the low pass filter (4; 41; 42; 4b) has a function of reducing harmonic components of the power supply voltage (V1; V11; V12) output from the tracker component (3; 3a; 3b), and the characteristics thereof are determined by an impedance characteristic including the path (81A) between the tracker component (3; 3a; 3b) and the low pass filter (4; 41; 42; 4b). The low pass filter (4; 41; 42; 4b) is disposed on or in the second substrate (substrate 2), and thus an effect of the low pass filter (4; 41; 42; 4b) can be stably obtained regardless of the positional relationship between the first substrate and the second substrate.

In a tracker module (1; 1a; 1b) according to a second exemplary aspect, in the first aspect, the tracker component (3; 3a; 3b) and the low pass filter (4; 41; 42; 4b) are integrated together into one package.

With the tracker module (1; 1a; 1b) according to the second exemplary aspect, parasitic resistance components generated in the path (81A; 81B) between the tracker component (3; 3a; 3b) and the low pass filter (4; 41; 42; 4b) are further reduced. As a result of further reducing the parasitic resistance components, the power consumption of the tracker module (1; 1a; 1b) is also further reduced.

In a tracker module (1; 1a; 1b) according to a third exemplary aspect, in the first or second aspect, the low pass filter (4; 41; 42; 4b) is disposed, on or in the second substrate (substrate 2), adjacent to the tracker component (3; 3a; 3b).

With the tracker module (1; 1a; 1b) according to the third exemplary aspect, the path (81A; 81B) between the tracker component (3; 3a; 3b) and the low pass filter (4; 41; 42; 4b) can be further shortened, and thus parasitic resistance components generated in the path (81A; 81B) between the tracker component (3; 3a; 3b) and the low pass filter (4; 41; 42; 4b) are further reduced. As a result of further reducing the parasitic resistance components, the power consumption of the tracker module (1; 1a; 1b) is also further reduced.

In a tracker module (1; 1a; 1b) according to a fourth exemplary aspect, in the third aspect, the low pass filter (4; 41; 42; 4b) includes a plurality of electronic components (401 to 404). At least one of the plurality of electronic components (401 to 404) is disposed adjacent to the tracker component (3; 3a; 3b).

In a tracker module (1; 1a; 1b) according to a fifth exemplary aspect, in any one of the first to fourth aspects, the second substrate (substrate 2) has a first main surface (21) and a second main surface (22) opposed to each other, and has a power amplifier connection terminal (24) to be connected to the power amplifier (61; 61a). The tracker component (3; 3a; 3b) and the low pass filter (4; 41; 42; 4b) are disposed on the first main surface (21) of the second substrate. The power amplifier connection terminal (24) is disposed on the second main surface (22) of the second substrate, and overlaps the low pass filter (4; 41; 42; 4b) in plan view in a thickness direction of the second substrate.

With the tracker module (1; 1a; 1b) according to the fifth exemplary aspect, a path between the low pass filter (4; 41; 42; 4b) and the power amplifier connection terminal (24), that is, a path (82A; 82B) between the low pass filter (4; 41; 42; 4b) and the power amplifier (61; 61a) can be shortened, and thus parasitic resistance components generated in the path (82A; 82B) between the low pass filter (4; 41; 42; 4b) and the power amplifier (61; 61a) are reduced. As a result of reducing the parasitic resistance components, the power consumption of the tracker module (1; 1a; 1b) is further reduced.

In a tracker module (1; 1a; 1b) according to a sixth exemplary aspect, in any one of the first to fifth aspects, the low pass filter (4; 41; 42; 4b) is formed by a single chip.

A tracker module (1; 1a; 1b) according to a seventh exemplary aspect includes a tracker component (3; 3a; 3b) and a low pass filter (4; 41; 42; 4b). The tracker component (3; 3a; 3b) is configured to output a power supply voltage (V1; V11; V12) for a power amplifier (61; 61a). The low pass filter (4; 41; 42; 4b) is connected to an output terminal of the tracker component (3; 3a; 3b). A first path length (L1; L3) of a path (81A; 81B) between the tracker component (3; 3a; 3b) and the low pass filter (4; 41; 42; 4b) is shorter than a second path length (L2; L4) of a path (82A; 82B) between the low pass filter (4; 41; 42; 4b) and the power amplifier (61; 61a).

With the tracker module (1; 1a; 1b) according to the seventh exemplary aspect, parasitic resistance components generated in the path (81A; 81B) between the tracker component (3; 3a; 3b) and the low pass filter (4; 41; 42; 4b) can be reduced. As a result of reducing the parasitic resistance components, the power consumption of the tracker module (1; 1a; 1b) is reduced.

A power amplifier module according to an eighth exemplary aspect includes the tracker module (1; 1a; 1b) according to any one of the first to seventh aspects, and the power amplifier (61; 61a).

With the power amplifier module according to the eighth exemplary aspect, in the tracker module (1; 1a; 1b), the path (81A; 81B) between the tracker component (3; 3a; 3b) and the low pass filter (4; 41; 42; 4b) can be shortened, and thus parasitic resistance components generated in the path (81A; 81B) between the tracker component (3; 3a; 3b) and the low pass filter (4; 41; 42; 4b) can be reduced. As a result of reducing the parasitic resistance components, the power consumption of the tracker module (1; 1a; 1b) is reduced.

A power amplifier module according to a ninth exemplary aspect, in the eighth aspect, further includes a control circuit (62). The control circuit (62) is configured to control the power amplifier (61). The power amplifier (61) includes an amplifier element (amplifier transistor 82), a plurality of bias circuits (85a to 85c), and a switch (86a to 86c). The plurality of bias circuits (85a to 85c) are configured to supply a bias current for the amplifier element. The switch (86a to 86c) is configured to switch between the plurality of bias circuits (85a to 85c). The control circuit (62) is configured to control the switch (86a to 86c) in response to a digital signal, to control the bias current for the amplifier element. The digital signal is different from a serial data signal that is based on a serial data transmission standard.

In a power amplifier module according to a tenth exemplary aspect, in the ninth aspect, the digital signal is generated based on an envelope signal.

A radio frequency module (5; 5a; 5b; 5c; 5d) according to an eleventh exemplary aspect includes the tracker module (1; 1a; 1b) according to any one of the first to seventh aspects, the power amplifier (61; 61a), and a transmission filter (filter 51). The transmission filter is configured to allow a radio frequency signal amplified by the power amplifier (61; 61a) to pass therethrough.

With the radio frequency module (5; 5a; 5b; 5c; 5d) according to the eleventh exemplary aspect, in the tracker module (1; 1a; 1b), the path (81A; 81B) between the tracker component (3; 3a; 3b) and the low pass filter (4; 41; 42; 4b) can be shortened, and thus parasitic resistance components generated in the path (81A; 81B) between the tracker component (3; 3a; 3b) and the low pass filter (4; 41; 42; 4b) can be reduced. As a result of reducing the parasitic resistance components, the power consumption of the tracker module (1; 1a; 1b) is reduced.

A radio frequency module (5c; 5d) according to a twelfth exemplary aspect, in the eleventh aspect, further includes a mounting substrate (55), a control circuit (62), a first terminal (591), and a second terminal (592; 593). The control circuit (62) is configured to control the power amplifier (61). The first terminal (591) is configured to receive a serial data signal. The serial data signal is a signal that is based on a serial data transmission standard. The second terminal (592; 593) is configured to receive a digital signal different from the serial data signal. The control circuit (62) is configured to perform control in response to the digital signal received from the second terminal (592; 593).

In a radio frequency module (5c; 5d) according to a thirteenth exemplary aspect, in the twelfth aspect, the second terminal includes a plurality of second terminals (592, 593). The plurality of second terminals (592, 593) are adjacent to each other.

In the radio frequency module (5c; 5d) according to the thirteenth exemplary aspect, variation of the wiring length is reduced and thus a rapid change of a digital signal can be realized.

A radio frequency module (5d) according to a fourteenth exemplary aspect, in the twelfth or thirteenth aspect, further includes at least two signal terminals (signal input terminal 561, antenna terminal 54a; 54b). The signal terminals are terminals through which the radio frequency signal passes. The second terminal (592; 593) is located between the two signal terminals.

In the radio frequency module (5d) according to the fourteenth aspect, the second terminal (592; 593) is a digital terminal (a terminal to which a digital signal is input) and is thus resistant to noise. Thus, signal interference between the signal terminals is reduced in a limited space.

A communication device (7) according to a fifteenth exemplary aspect includes the radio frequency module (5; 5a; 5b; 5c; 5d) according to any one of the eleventh to fourteenth aspects, and a signal processing circuit (72). The signal processing circuit (72) is configured to output a radio frequency signal to the radio frequency module (5; 5a; 5b; 5c; 5d).

With the communication device (7) according to the fifteenth exemplary aspect, in the tracker module (1; 1a; 1b), the path (81A; 81B) between the tracker component (3; 3a; 3b) and the low pass filter (4; 41; 42; 4b) can be shortened, and thus parasitic resistance components generated in the path (81A; 81B) between the tracker component (3; 3a; 3b) and the low pass filter (4; 41; 42; 4b) can be reduced. As a result of reducing the parasitic resistance components, the power consumption of the tracker module (1; 1a; 1b) is reduced.

What is claimed:

1. A tracker module comprising:
   a first substrate that is separate from a second substrate on or in-which a power amplifier is disposed, the first substrate having a first main surface and a second main surfaces that are opposite to each other;
   a tracker component configured to supply a power supply voltage to the power amplifier; and
   a low pass filter disposed between an output terminal of the tracker component and the power amplifier,
   wherein the tracker component and the low pass filter are disposed on the first main surface of the first substrate,
   wherein the first substrate has a power amplifier connection terminal configured to connect to the power amplifier and that is disposed on the second main surface of the first substrate and that overlaps the low pass filter in a plan view in a thickness direction of the first substrate.

2. The tracker module according to claim 1, wherein the tracker component and the low pass filter are integrated together into a single package.

3. The tracker module according to claim 1, wherein the low pass filter is disposed on the first substrate and adjacent to the tracker component.

4. The tracker module according to claim 3, wherein:
   the low pass filter includes a plurality of electronic components, and
   at least one of the plurality of electronic components is disposed adjacent to the tracker component.

5. The tracker module according to claim 1, wherein the low pass filter comprises a single chip.

6. A power amplifier module comprising:
   the tracker module according to claim 1; and
   the power amplifier.

7. The power amplifier module according to claim 6, further comprising:
   a control circuit configured to control the power amplifier,
   wherein the power amplifier includes:
      an amplifier element,
      a plurality of bias circuits configured to supply a bias current for the amplifier element, and
      a switch configured to switch between the plurality of bias circuits.

8. The power amplifier module according to claim 7, wherein the control circuit is configured to control the switch in response to a digital signal that is configured to control the bias current for the amplifier element.

9. The power amplifier module according to claim 8, wherein the digital signal is generated based on an envelope signal.

10. The tracker module according to claim 1,
wherein a first path length of a path between the tracker component and the low pass filter is shorter than a second path length of a path between the low pass filter and the power amplifier.

11. The tracker module according to claim 10, wherein the tracker component and the low pass filter are integrated together into a single package.

12. The tracker module according to claim 10, wherein:
the low pass filter is disposed in a substrate and includes a plurality of electronic components, and
at least one of the plurality of electronic components is disposed in the substrate and adjacent to the tracker component.

13. A radio frequency module comprising:
a tracker module comprising:
  a first substrate that is separate from a second substrate on which a power amplifier is disposed, the first substrate having a first main surface and a second main surfaces that are opposite to each other;
  a tracker component configured to supply a power supply voltage to the power amplifier;
  a low pass filter disposed between an output terminal of the tracker component and the power amplifier,
  wherein the tracker component and the low pass filter are disposed on the first main surface of the first substrate;
a transmission filter configured to allow a radio frequency signal amplified by the power amplifier to pass therethrough;
a control circuit configured to control the power amplifier;
a first terminal configured to receive a serial data signal that is based on a serial data transmission standard; and
a second terminal configured to receive a digital signal different from the serial data signal.

14. The radio frequency module according to claim 13, wherein the control circuit is configured to perform control in response to the digital signal received from the second terminal.

15. The radio frequency module according to claim 13, wherein the second terminal comprises a plurality of second terminals that are adjacent to each other.

16. The radio frequency module according to claim 13, further comprising:
at least two signal terminals through which the radio frequency signal passes,
wherein the second terminal is located between the two signal terminals.

17. A communication device comprising:
the radio frequency module according to claim 13; and
a signal processing circuit configured to output a radio frequency signal to the radio frequency module.

* * * * *